(12) United States Patent
Yamaguchi

(10) Patent No.: US 10,589,636 B2
(45) Date of Patent: *Mar. 17, 2020

(54) CURRENT MODE CONTROL TYPE SWITCHING POWER SUPPLY DEVICE

(71) Applicant: Rohm Co., Ltd., Kyoto (JP)

(72) Inventor: Yuhei Yamaguchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/926,375

(22) Filed: Mar. 20, 2018

(65) Prior Publication Data

US 2018/0208065 A1 Jul. 26, 2018

Related U.S. Application Data

(63) Continuation of application No. 14/859,602, filed on Sep. 21, 2015, now Pat. No. 9,925,879.

(30) Foreign Application Priority Data

Sep. 24, 2014 (JP) ................................. 2014-194228

(51) Int. Cl.
*B60L 50/50* (2019.01)
*H02J 1/00* (2006.01)
*H03K 17/56* (2006.01)
*G05F 3/26* (2006.01)

(52) U.S. Cl.
CPC .............. *B60L 50/50* (2019.02); *G05F 3/262* (2013.01); *H02J 1/00* (2013.01); *H03K 17/56* (2013.01)

(58) Field of Classification Search
CPC ............ B60L 53/12; G05F 3/262; H02J 1/00; H03K 17/56

USPC ................................................... 307/9.1, 10.1
See application file for complete search history.

(56) References Cited

U.S. PATENT DOCUMENTS

| | | | |
|---|---|---|---|
| 6,166,528 | A | 12/2000 | Rossetti et al. |
| 2008/0111531 | A1 | 5/2008 | Hasegawa et al. |
| 2010/0327831 | A1 | 12/2010 | Nishida |
| 2011/0089918 | A1 | 4/2011 | Chang |

(Continued)

FOREIGN PATENT DOCUMENTS

| | | |
|---|---|---|
| CN | 101924469 | 12/2010 |
| CN | 20175034 | 2/2011 |

(Continued)

OTHER PUBLICATIONS

Japan Patent Office, Office Action for corresponding Japanese Application No. 2018-044300 dated Nov. 20, 2018 with English Translation.

(Continued)

*Primary Examiner* — Hal Kaplan
(74) *Attorney, Agent, or Firm* — Fish & Richardson P.C.

(57) ABSTRACT

A switching power supply device includes a first switch, a second switch, a current sensing portion configured to sense current flowing in the second switch, and a controller configured to control the first and second switches. The controller controls the first switch and the second switch in accordance with current sensed by the current sensing portion if a ratio of the output voltage to the input voltage is a predetermined value or lower, and controls the first switch and the second switch independently of the current sensed by the current sensing portion if the ratio of the output voltage to the input voltage is higher than the predetermined value.

14 Claims, 17 Drawing Sheets

(56) References Cited

U.S. PATENT DOCUMENTS

2012/0326688 A1    12/2012   Sun et al.
2013/0162230 A1    6/2013   Miyamae
2013/0293211 A1    11/2013   Chen
2014/0145692 A1    5/2014   Miyamae

FOREIGN PATENT DOCUMENTS

| | | |
|---|---|---|
| CN | 103178714 | 6/2013 |
| CN | 103378731 | 10/2013 |
| JP | 2010-220355 | 9/2010 |
| WO | 2009/035013 | 3/2009 |

OTHER PUBLICATIONS

Japanese Patent Office; Office Action mailed in counterpart Japanese Patent Application No. 2018-044300 (dated Mar. 5, 2019) with English-language translation.

CURRENT MODE CONTROL TYPE SWITCHING POWER SUPPLY DEVICE

CROSS-REFERENCE TO RELATED APPLICATIONS

This application is a continuation of U.S. patent application Ser. No. 14/859,602, filed Sep. 21, 2015, now U.S. Pat. No. 9,925,879 to issue Mar. 27, 2018. This application claims priority under 35 U.S.C. § 119(a) on Patent Application No. 2014-194228 filed in Japan on Sep. 24, 2014, the entire contents of which are hereby incorporated by reference.

BACKGROUND OF THE INVENTION

Field of the Invention

The present invention relates to a current mode control type switching power supply device that can perform a step down operation for stepping down an input voltage.

Description of Related Art

Control methods of switching power supply devices can be roughly divided into a voltage mode control and a current mode control. In general, the current mode control is very effective in view of simplification of phase compensation, fast response, and reduction of the number of external components. An example of the current mode control type switching power supply device is shown in FIG. 14.

A switching power supply device 100 shown in FIG. 14 senses current flowing in an upper metal oxide semiconductor (MOS) transistor Q1 so as to perform the current mode control. In accordance with the current mode control, the upper MOS transistor Q1 and a lower MOS transistor Q2 are complementarily turned on and off, and an input voltage $V_{IN}$ is converted into a pulse-like switched voltage $V_{SW}$ by this switching operation. Then, the switched voltage $V_{SW}$ is smoothed by an inductor and an output capacitor and is converted into an output voltage $V_{OUT}$ lower than the input voltage $V_{IN}$.

When the current flowing in the upper MOS transistor Q1 is sensed so as to perform the current mode control, a fed-back portion of the current corresponds to a difference between the input voltage and the switched voltage ($V_{IN}-V_{SW}$), and hence a current sensing circuit generates information of the sensed current with respect to the input voltage $V_{IN}$. Accordingly, when the current information is transmitted to a slope circuit configured to generate a slope voltage $V_{SLP}$ with respect to an internal source voltage, there occurs a delay time D after the upper MOS transistor Q1 is turned on until the current information is transmitted to the slope voltage $V_{SLP}$, as shown in FIG. 15.

In addition, because the fed-back portion of the current corresponds to the difference between the input voltage and the switched voltage ($V_{IN}-V_{SW}$), if noise is added to a leading edge or the like of the switched voltage $V_{SW}$, the noise is transmitted as it is and is reflected on the slope voltage $V_{SLP}$.

Further, when a pulse width of the switched voltage $V_{SW}$ is decreased, the above-mentioned delay time and noise become dominant, and there occurs a problem that current feedback cannot be performed.

Note that the current mode control type switching power supply device disclosed in JP-A-2010-220355 also performs the current mode control by sensing current flowing in an upper switching element similarly to the switching power supply device 100 shown in FIG. 14, and hence has the same problem.

SUMMARY OF THE INVENTION

A current mode control type switching power supply device according to an embodiment disclosed in this specification includes a first switch having a first terminal connected to a first application terminal to which an input voltage is applied, a second switch having a first terminal connected to a second terminal of the first switch and a second terminal connected to a second application terminal to which a predetermined voltage lower than the input voltage is applied, a current sensing portion configured to sense current flowing in the second switch, and a controller configured to control the first switch and the second switch. Further, the controller controls the first switch and the second switch in accordance with the current sensed by the current sensing portion if the ratio of the output voltage to the input voltage is a predetermined value or smaller, and controls the first switch and the second switch independently of the current sensed by the current sensing portion if the ratio of the output voltage to the input voltage is larger than the predetermined value.

Meanings and effects of the present invention will become apparent from the description of embodiments given below. However, the embodiments described below are merely examples of the present invention. The present invention and meanings of terms of structural elements are not limited to those shown in the embodiments described below.

DETAILED DESCRIPTION OF THE PREFERRED EMBODIMENTS

General Structure (First Embodiment)

Figure 1:
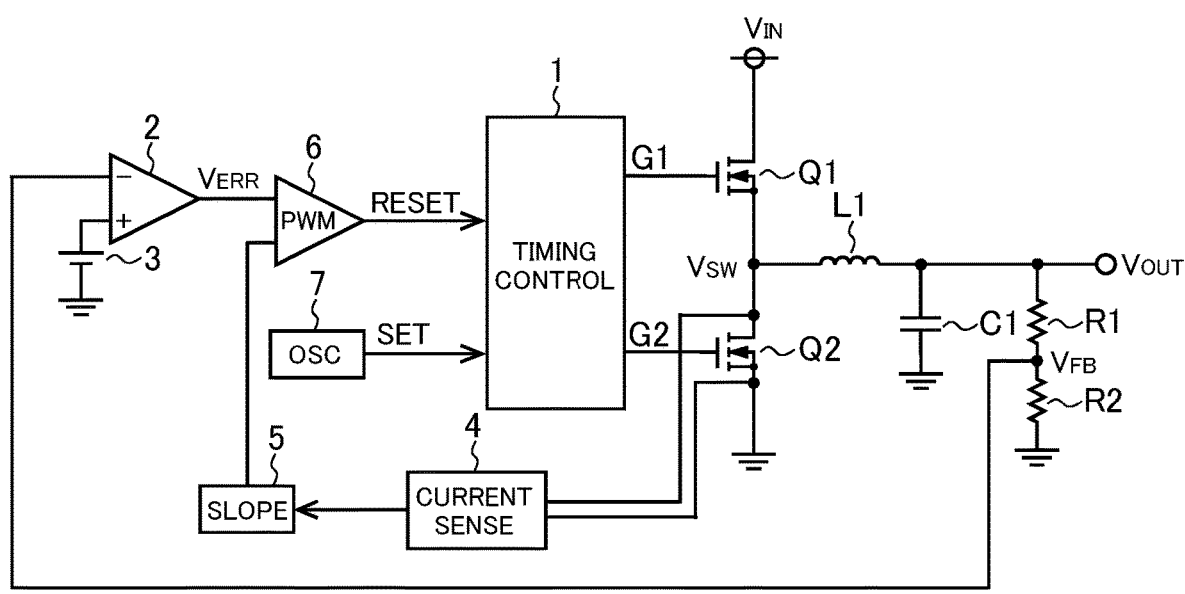
FIG. 1 is a diagram showing an example of a general structure of a first embodiment of a switching power supply device.

FIG. 1 is a diagram showing an example of a general structure of a first embodiment of a current mode control type switching power supply device. A switching power supply device 101 of this structural example is a current mode control type switching power supply device that performs a step down operation for stepping down an input voltage and includes a timing control circuit 1, an upper MOS transistor Q1, a lower MOS transistor Q2, an inductor L1, an output capacitor C1, voltage dividing resistors R1 and R2, an error amplifier 2, a reference voltage source 3, a current sensing circuit 4, a slope circuit 5, a comparator 6, and an oscillator 7.

The timing control circuit 1 controls on and off of the upper MOS transistor Q1 and on and off of the lower MOS transistor Q2, and generates a gate signal G1 of the upper MOS transistor Q1 and a gate signal G2 of the lower MOS transistor Q2 in accordance with a set signal SET and a reset signal RESET.

The upper MOS transistor Q1 is an N-channel MOS transistor as an example of an upper switch configured to make and break a current path from an input voltage application terminal applied with an input voltage $V_{IN}$ to the inductor L1. A drain of the upper MOS transistor Q1 is connected to the input voltage application terminal applied with the input voltage $V_{IN}$. A source of the upper MOS transistor Q1 is connected to a terminal of the inductor and a drain of the lower MOS transistor Q2. A gate of the upper MOS transistor Q1 is provided with the gate signal G1 from the timing control circuit 1. The upper MOS transistor Q1 is turned on when the gate signal G1 is high level and is turned off when the gate signal G1 is low level.

The lower MOS transistor Q2 is an N-channel MOS transistor as an example of a lower switch configured to make and break a current path from a ground terminal to the inductor L1. The drain of the lower MOS transistor Q2 is connected to the terminal of the inductor and the source of the upper MOS transistor Q1 as described above. A source of the lower MOS transistor Q2 is connected to the ground terminal. A gate of the lower MOS transistor Q2 is supplied with a gate signal G2 from the timing control circuit 1. The lower MOS transistor Q2 is turned on when the gate signal G2 is high level and is turned off when the gate signal G2 is low level. Note that a diode can be used instead of the lower MOS transistor Q2 as the lower switch, but in this case, it is necessary to dispose a sense resistor connected in series to the diode so that the current sensing circuit 4 senses a voltage between both ends of the sense resistor.

The upper MOS transistor Q1 and the lower MOS transistor Q2 are complementarily turned on and off by control by the timing control circuit 1. In this way, a pulse-like switched voltage $V_{SW}$ is generated at a connection node between the upper MOS transistor Q1 and the lower MOS transistor Q2. Note that it is preferred to set a dead time in which both the upper MOS transistor Q1 and the lower MOS transistor Q2 are off when on/off states of the upper MOS transistor Q1 and the lower MOS transistor Q2 are exchanged.

The inductor L1 and the output capacitor C1 smooth the pulse-like switched voltage $V_{SW}$ so as to generate an output voltage $V_{OUT}$ and supply the output voltage $V_{OUT}$ to an application terminal of the output voltage $V_{OUT}$.

The voltage dividing resistors R1 and R2 divide the output voltage $V_{OUT}$ so as to generate a feedback voltage $V_{FB}$.

The error amplifier 2 generates an error signal $V_{ERR}$ corresponding to a difference between the feedback voltage $V_{FB}$ and a reference voltage output from the reference voltage source 3.

The current sensing circuit 4 senses current flowing in the lower MOS transistor Q2 on the basis of a drain-source voltage when the lower MOS transistor Q2 is on, namely a voltage between both ends of an on resistor of the lower MOS transistor Q2.

The slope circuit 5 generates and outputs a slope voltage corresponding to the current flowing in the lower MOS transistor Q2 sensed by the current sensing circuit 4.

The comparator 6 compares the output voltage of the slope circuit 5 with the error signal $V_{ERR}$ so as to generate the reset signal RESET as a comparison signal. Because a slope voltage $V_{SLP}$ generated by the slope circuit 5 has a fixed period, the reset signal RESET becomes a pulse width modulation (PWM) signal.

The oscillator 7 generates the set signal SET that is a clock signal having a predetermined frequency.

First Generation Example of Slope Voltage

Figure 2:
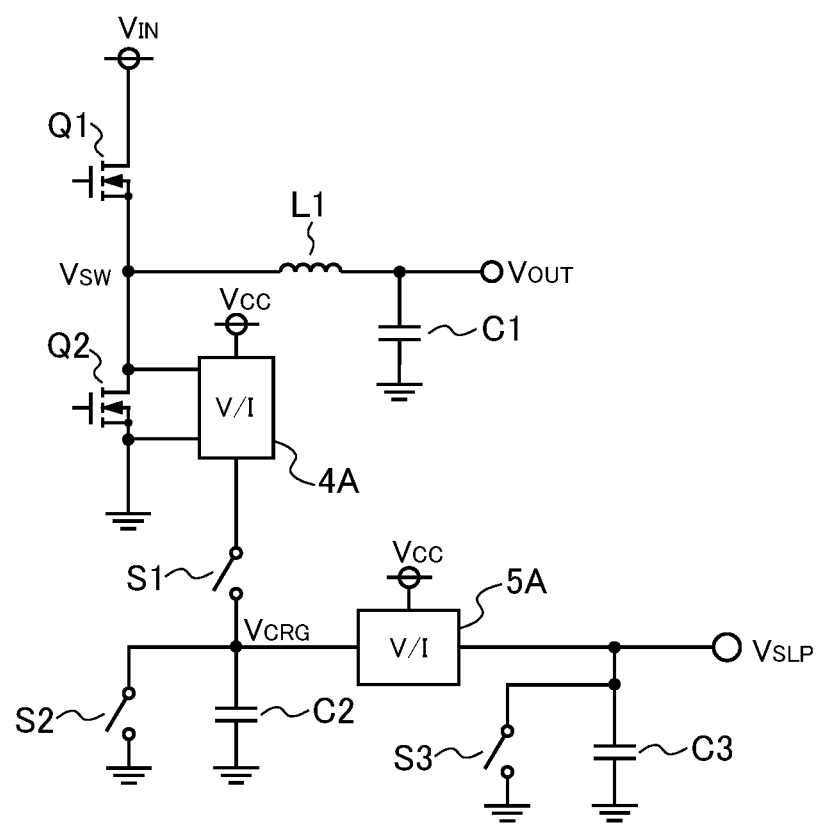
FIG. 2 is a diagram showing a structural example of a current sensing circuit and a slope circuit.

FIG. 2 is a diagram showing a structural example of the current sensing circuit 4 and the slope circuit 5. In the example shown in FIG. 2, the current sensing circuit 4 is constituted of the voltage current conversion circuit 4A. In addition, in the example shown in FIG. 2, the slope circuit 5 is constituted of switches S1 to S3, capacitors C2 and C3, and a voltage current conversion circuit 5A.

Each of the voltage current conversion circuits 4A and 5A is a circuit driven by an internal source voltage $V_{CC}$ generated in an integrated circuit (IC) including the timing control circuit 1, the error amplifier 2, the reference voltage source 3, the current sensing circuit 4, the slope circuit 5, the comparator 6, and the oscillator 7.

The voltage current conversion circuit 4A converts a drain-source voltage of the lower MOS transistor Q2 into current and outputs the current. When the switch S1 is on, the capacitor C2 is charged by output current of the voltage current conversion circuit 4A. On the other hand, when the switch S2 is on, the capacitor C2 is discharged.

The voltage current conversion circuit 5A converts a charge voltage $V_{CRG}$ of the capacitor C2 into current and outputs the current. The output current of the voltage current conversion circuit 5A charges the capacitor C3. On the other hand, when the switch S3 is on, the capacitor C3 is discharged. A charge voltage of the capacitor C3 becomes the slope voltage $V_{SLP}$.

Figure 3A:
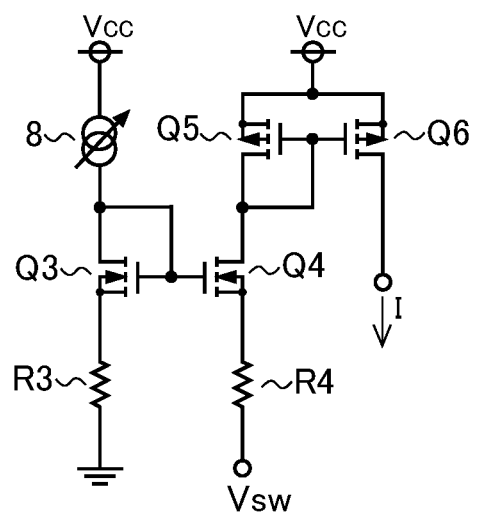
FIG. 3A is a diagram showing a structural example of a voltage current conversion circuit 4A.
Figure 3B:
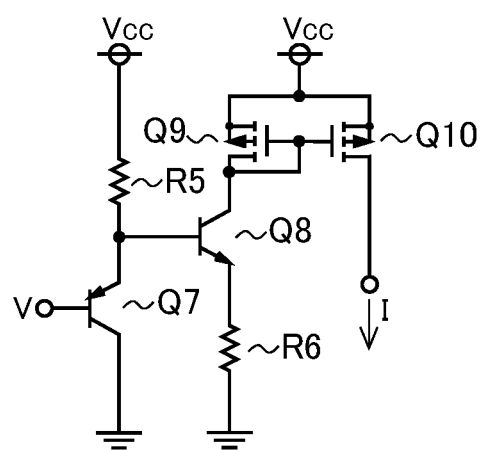
FIG. 3B is a diagram showing a structural example of a voltage current conversion circuit 5A.

FIGS. 3A and 3B are diagrams showing structural examples of the voltage current conversion circuits 4A and 5A. In the voltage current conversion circuit shown in FIG. 3A, a current source 8 supplies current to a current mirror circuit constituted of N-channel MOS transistors Q3 and Q4. If a mirror ratio of the current mirror circuit constituted of the N-channel MOS transistors Q3 and Q4 is 1:1, current flowing in a resistor R4 has a value obtained by dividing the switched voltage $V_{SW}$ by a difference (r3-r4) between a resistance value r3 of a resistor R3 and a resistance value r4 of the resistor R4. Further, the current mirror circuit constituted of P-channel type MOS transistors Q5 and Q6 outputs current corresponding to the current flowing in the resistor R4 (current corresponding to the switched voltage $V_{SW}$ as the input voltage of the voltage current conversion circuit 4A) as the output current of the voltage current conversion circuit 4A. In the voltage current conversion circuit shown in FIG. 3B, current corresponding to the input voltage of the voltage current conversion circuit flows in a resistor R5 by a series circuit of the resistor R5 and a PNP transistor Q7, and a voltage corresponding to the input voltage of the voltage current conversion circuit is generated at a connection node between the resistor R5 and the PNP transistor Q7. Further, current corresponding to the voltage at the connection node between the resistor R5 and the PNP transistor Q7 (voltage corresponding to the input voltage of the voltage current conversion circuit) flows in a resistor R6 by a series circuit of an NPN transistor Q8 and the resistor R6. Further, a current mirror circuit constituted of P-channel type MOS transistors Q9 and Q10 outputs current corresponding to the current flowing in the resistor R6 (current corresponding to an input voltage V of the voltage current conversion circuit 5A) as the output current of the voltage current conversion circuit.

Figure 4A:
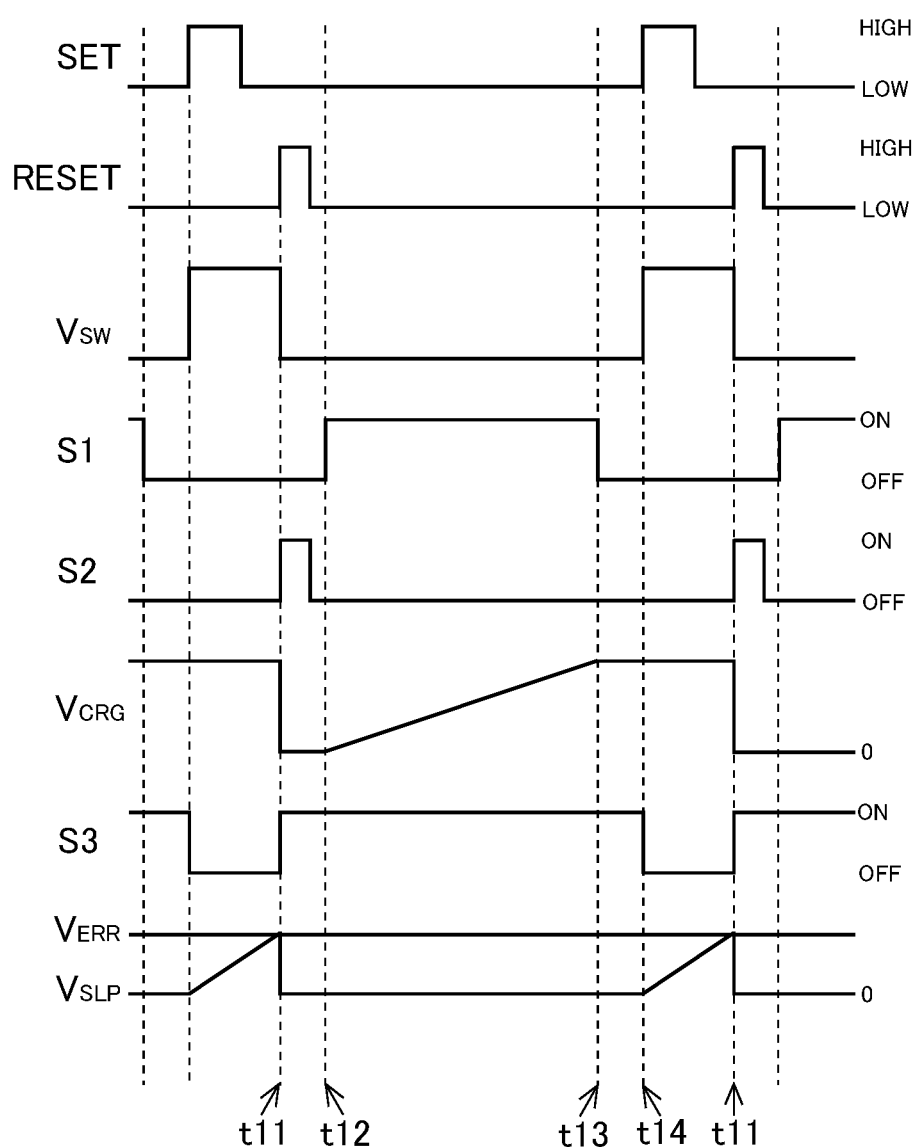
FIG. 4A is a timing chart showing an operation example of the switching power supply device.

FIG. 4A is a timing chart showing an operation example of the switching power supply device 101.

In the example shown in FIG. 4A, the timing control circuit 1 switches the gate signal G1 from low level to high level when the set signal SET is switched from low level to high level, and switches the gate signal G1 from high level to low level when the reset signal RESET is switched from low level to high level. The slope circuit 5 changes on and off of the switches S1 to S3 in accordance with an instruction from the timing control circuit 1.

When the reset signal RESET is switched from low level to high level (at timing t11), the slope circuit 5 maintains the off state of the switch S1, changes the switch S2 from the off state to the on state, and changes the switch S3 from the off state to the on state. In this way, the capacitors C2 and C3 are discharged, and each of the charge voltage $V_{CRG}$ of the capacitor C2 and the slope voltage $V_{SLP}$ becomes zero.

Then, the slope circuit 5 changes the switch S2 from the on state to the off state so as to finish discharging the capacitor C2. After that, at timing t12, the slope circuit 5 changes the switch S1 from the off state to the on state. The timing t12 can be, for example, the end timing of the dead time just after the upper MOS transistor Q1 is switched from the on state to the off state.

Next, at timing t13, the slope circuit 5 changes the switch S1 from the on state to the off state. The timing t13 can be, for example, the start timing of a dead time just after the lower MOS transistor Q2 is switched from the on state to the off state.

During the period from the timing t12 to the timing t13, a current path from a voltage current conversion circuit 4A to the capacitor C2 is formed by the switch S1, and hence information of the current flowing in the lower MOS transistor Q2 is accumulated in a form of the charge voltage $V_{CRG}$.

After that, when the set signal SET is switched from low level to high level (at timing t14), the slope circuit 5 changes the switch S3 from the on state to the off state. During the period from the timing t14 to the next timing t11 (while the upper MOS transistor Q1 is on), the output current of the voltage current conversion circuit 5A charges the capacitor C3, and hence the information of the current flowing in the lower MOS transistor Q2 during the period from the timing t12 to the timing t13 is transmitted and reflected on the slope voltage $V_{SLP}$.

According to the switching power supply device 101, the fed-back portion of the current corresponds to a difference ($V_{SW}$-GND) between the switched voltage $V_{SW}$ and the ground voltage. Accordingly, both the current sensing circuit 4 and the slope circuit 5 can be operated on the basis of the internal source voltage $V_{CC}$ like this generation example of the slope voltage, and hence a delay time that can be generated when the current sensing circuit 4 transmits the current information to the slope circuit 5 can be decreased.

In addition, in this generation example of the slope voltage, because the information of the current flowing in the lower MOS transistor Q2 is accumulated in a form of the charge voltage $V_{CRG}$ during the period from the timing t12 to the timing t13, even if noise is applied to a leading edge or the like of the switched voltage $V_{SW}$, the noise is averaged during the period from the timing t12 to the timing t13. In other words, amount of noise per unit time that is transmitted and reflected on the slope voltage $V_{SLP}$ can be reduced.

According to this generation example of the slope voltage, current feedback can be performed even if a ratio of the output voltage $V_{OUT}$ to the input voltage $V_{IN}$ is small (even if a pulse width of the switched voltage $V_{SW}$ is small).

Figure 4B:
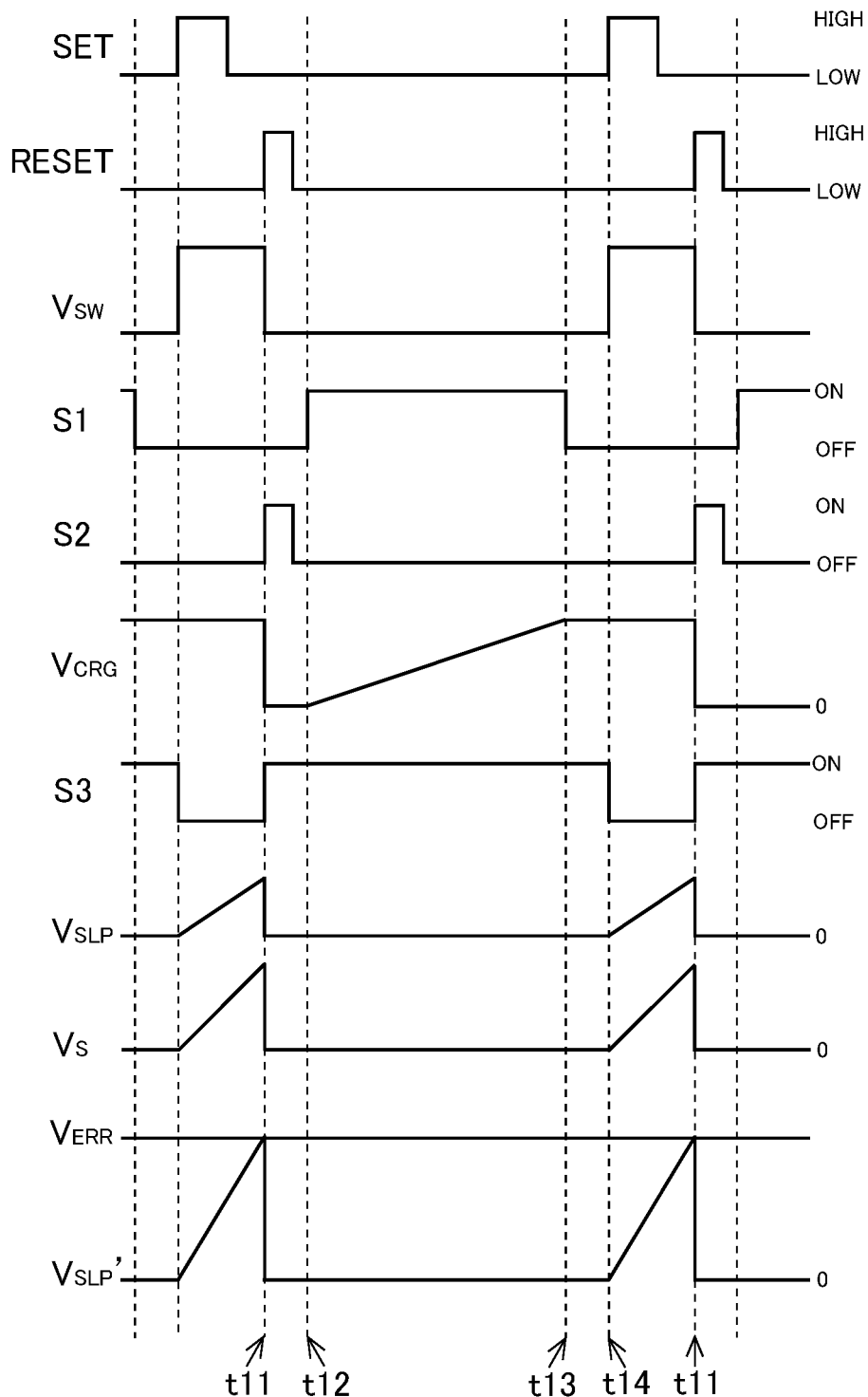
FIG. 4B is a timing chart showing a variation of the operation example shown in FIG. 4A.

Further, in view of stabilizing control system of the current mode control, it is preferred to dispose a superimposing portion in the slope circuit 5, so that the superimposing portion generates a voltage (a new slope voltage $V_{SLP}'$) in which a sawtooth wave-like or triangle wave-like pseudo slope voltage $V_S$ increasing at a constant rate during the period from the timing t14 to the timing t11 is superimposed on the slope voltage $V_{SLP}$, and to output the new slope voltage $V_{SLP}'$ as the output voltage of the slope circuit 5. In this case, as shown in FIG. 4B, when the slope voltage $V_{SLP}'$ exceeds the error signal $V_{ERR}$, the reset signal RESET is switched from low level to high level.

Second Generation Example of Slope Voltage

Structures of the current sensing circuit 4 and the slope circuit 5 are the same as those in the first generation example of the slope voltage described above.

Figure 5A:
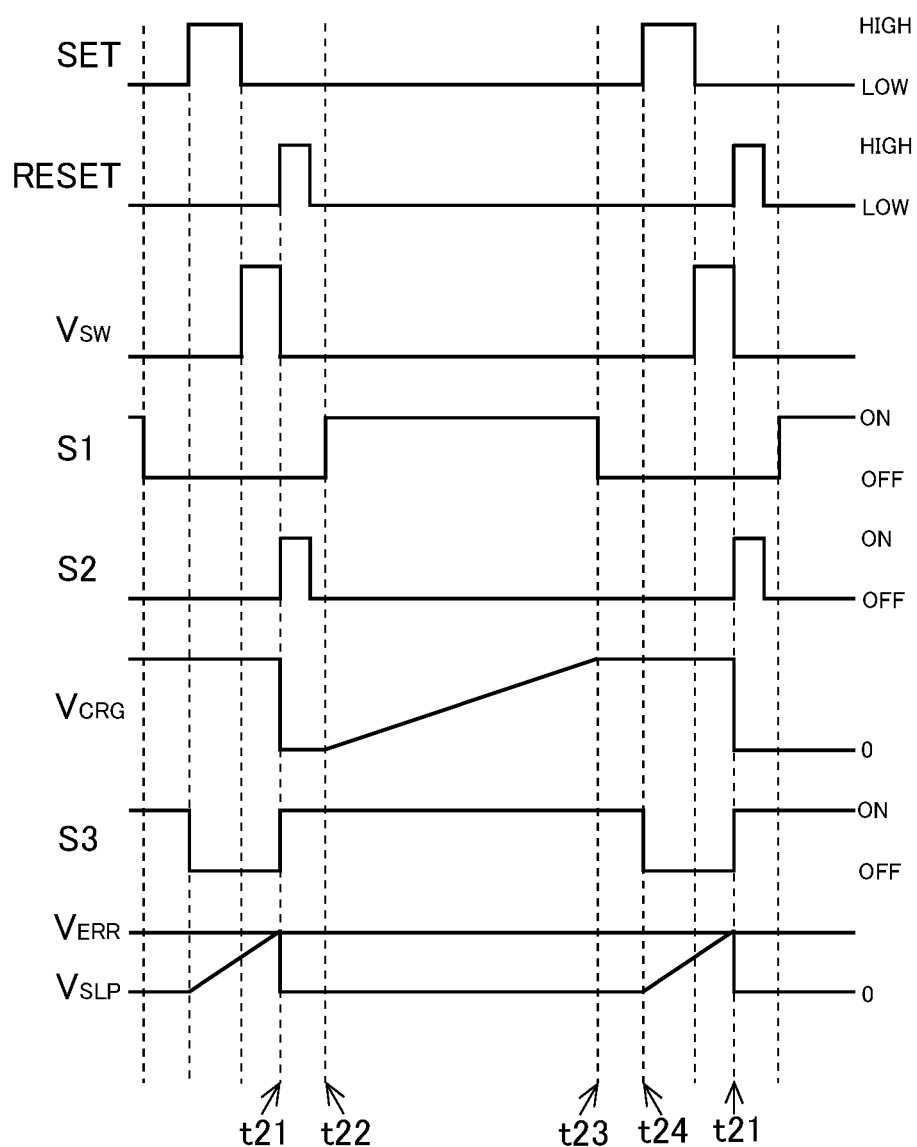
FIG. 5A is a timing chart showing another operation example of the switching power supply device.

FIG. 5A is a timing chart showing another operation example of the switching power supply device 101.

In the example shown in FIG. 5A, the timing control circuit 1 switches the gate signal G1 from low level to high level when the set signal SET is switched from high level to low level, and switches the gate signal G1 from high level to low level when the reset signal RESET is switched from low level to high level. The slope circuit 5 changes on and off of the switches S1 to S3 in accordance with an instruction from the timing control circuit 1.

When the reset signal RESET is switched from low level to high level (at timing t21), the slope circuit 5 maintains the off state of the switch S1, changes the switch S2 from the off state to the on state, and changes the switch S3 from the off state to the on state. In this way, the capacitors C2 and C3 are discharged, so that each of the charge voltage $V_{CRG}$ of the capacitor C2 and the slope voltage $V_{SLP}$ becomes zero.

Then, the slope circuit 5 changes the switch S2 from the on state to the off state so as to finish discharging the capacitor C2. After that, the slope circuit 5 changes the switch S1 from the off state to the on state at timing t22. The timing of t22 can be the end timing of the dead time just after the upper MOS transistor Q1 is switched from the on state to the off state, for example.

Next, at timing t23, the slope circuit 5 changes the switch S1 from the on state to the off state. The timing of t23 can be the start timing of a dead time just after the lower MOS transistor Q2 is switched from the on state to the off state, for example.

Because the current path from the voltage current conversion circuit 4A to the capacitor C2 is formed by the switch S1 during the period from the timing t22 to the timing t23, the information of the current flowing in the lower MOS transistor Q2 is accumulated in a form of the charge voltage $V_{CRG}$.

After that, when the set signal SET is switched from low level to high level (at timing t24), the slope circuit 5 changes the switch S3 from the on state to the off state. During the output current of the voltage current conversion circuit 5A charges the capacitor C3 during the period from the timing t24 to the next timing t21, the information of the current flowing in the lower MOS transistor Q2 during the period from the timing t22 to the timing t23 is transmitted and reflected on the slope voltage $V_{SLP}$.

In the first generation example of the slope voltage described above, transmission of the information of the current flowing in the lower MOS transistor Q2 is started so as to be reflected on the slope voltage $V_{SLP}$ at the same time when the upper MOS transistor Q1 is switched from the off state to the on state. In contrast, in this generation example of the slope voltage, the transmission of the information of the current flowing in the lower MOS transistor Q2 is started before the upper MOS transistor Q1 is switched from the off state to the on state so as to be reflected on the slope voltage $V_{SLP}$. Accordingly, in this generation example of the slope voltage, the minimum pulse width of the switched voltage $V_{SW}$ that enables the current feedback can be smaller than that in the first generation example of the slope voltage described above.

Figure 5B:
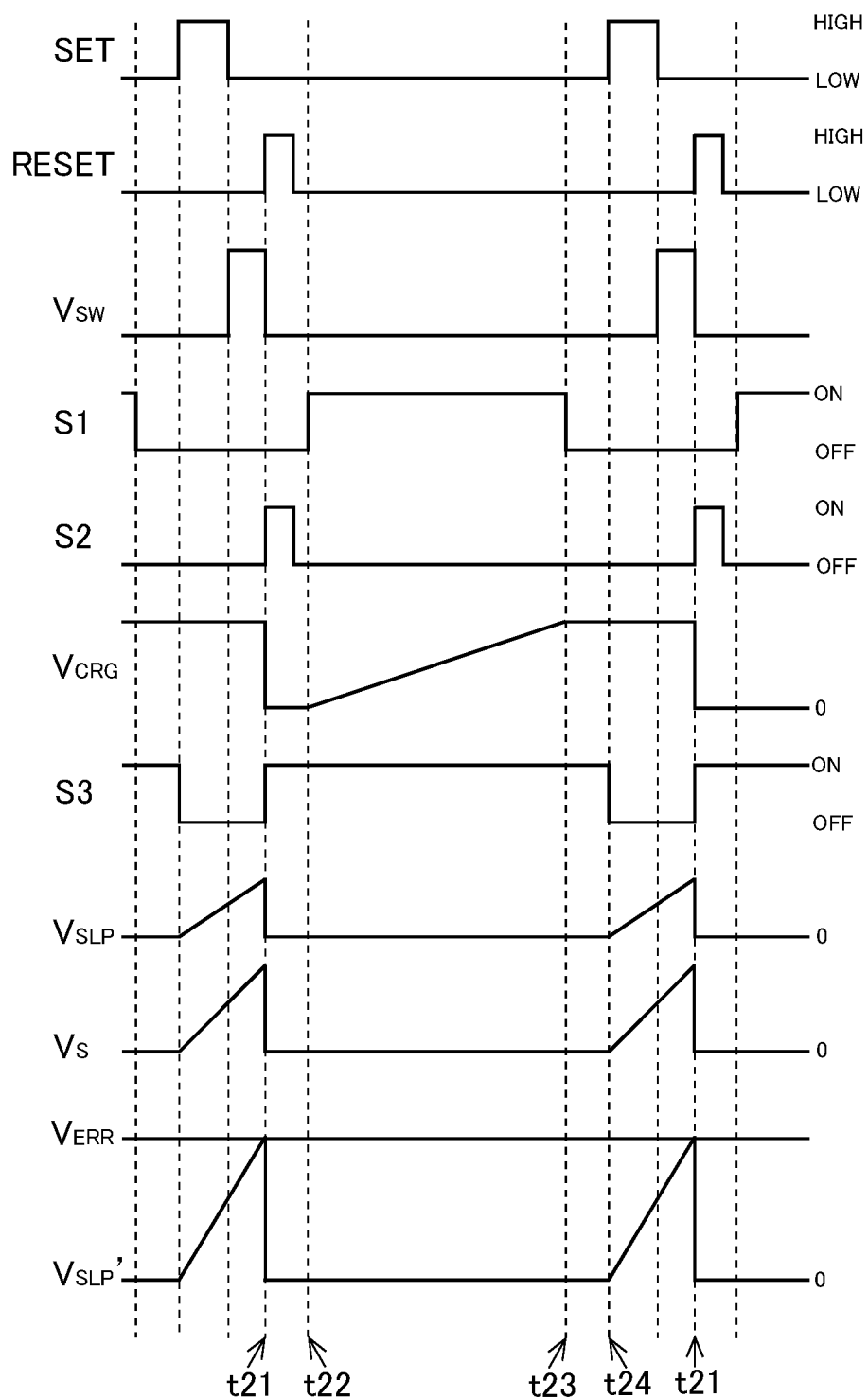
FIG. 5B is a timing chart showing of a variation of the operation example shown in FIG. 5A.

Further, in view of stabilizing control system of the current mode control, it is preferred to dispose a superimposing portion in the slope circuit 5, so that the superimposing portion generates a voltage (a new slope voltage $V_{SLP}'$) in which a sawtooth wave-like or triangle wave-like pseudo slope voltage $V_S$ increasing at a constant rate during the period from the timing t24 to the timing t21 is superimposed on the slope voltage $V_{SLP}$, and to output the new slope voltage $V_{SLP}'$ as the output voltage of the slope circuit 5. In this case, as shown in FIG. 5B, when the slope voltage $V_{SLP}'$ exceeds the error signal $V_{ERR}$, the reset signal RESET is switched from low level to high level.

Third Generation Example of Slope Voltage

Structures of the current sensing circuit 4 and the slope circuit 5 are the same as those in the first generation example and the second generation example of the slope voltage.

Figure 6A:
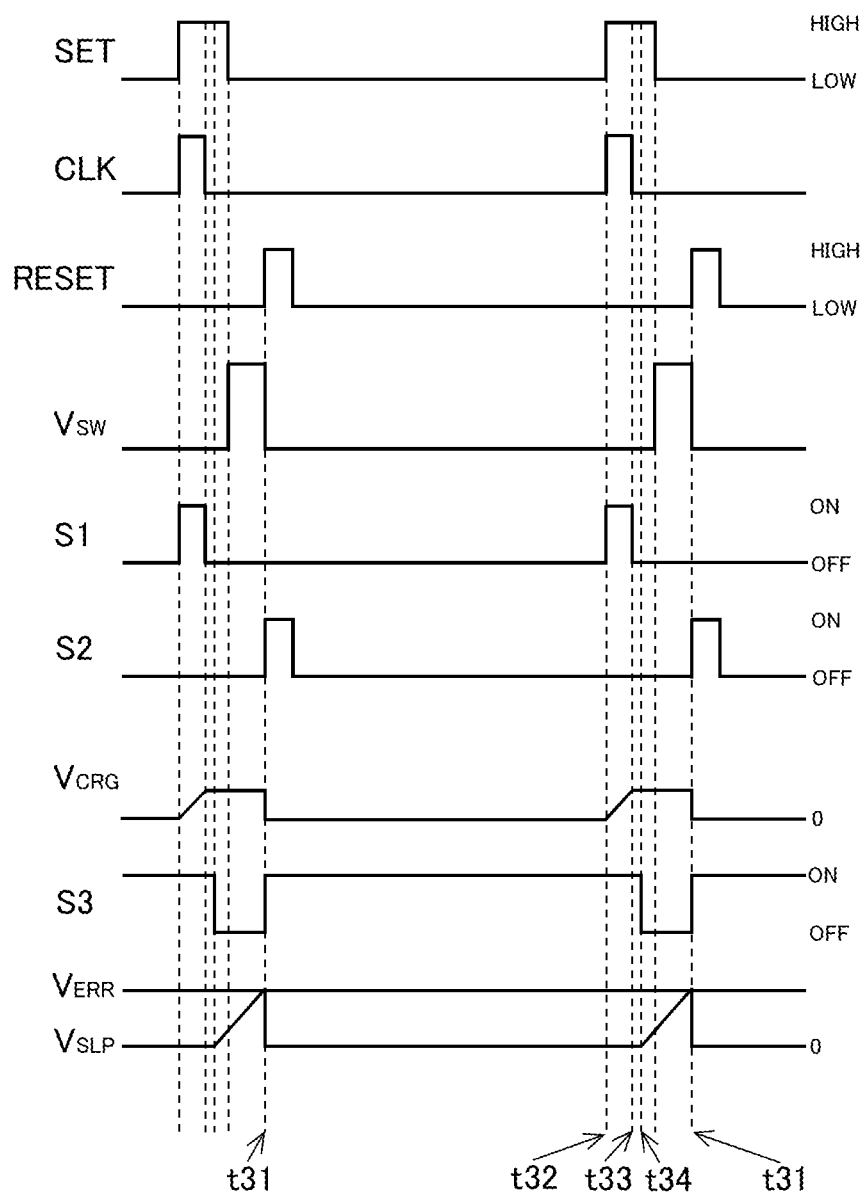
FIG. 6A is a timing chart showing still another operation example of the switching power supply device.

FIG. 6A is a timing chart showing a still another operation example of the switching power supply device 101.

In the example shown in FIG. 6A, the timing control circuit 1 switches the gate signal G1 from low level to high level when the set signal SET is switched from high level to low level, and switches the gate signal G1 from high level to low level when the reset signal RESET is switched from low level to high level.

In addition, the timing control circuit 1 switches an internal clock signal CLK from low level to high level when the set signal SET is switched from low level to high level, on the basis of the set signal SET, so as to generate the internal clock signal CLK having a high level period shorter than a high level period of the set signal SET. Note that each high level period of the internal clock signal CLK is a constant period of time in which the current feedback is performed in the third generation example of the slope voltage. Note that it is preferred to adjust each high level period of the internal clock signal CLK so that the internal clock signal CLK is switched from high level to low level before the dead time starts just after the lower MOS transistor Q2 is switched from the on state to the off state.

Further, when the internal clock signal CLK is switched from low level to high level, regardless of a level changing state of the reset signal RESET, the timing control circuit 1 forces the gate signal G1 to be low level and the gate signal G2 to be high level. In this way, when the internal clock signal CLK is switched from low level to high level, the current feedback can be securely started.

The slope circuit 5 changes on and off of the switches S1 to S3 in accordance with an instruction from the timing control circuit 1.

When the reset signal RESET is switched from low level to high level (at timing t31), the slope circuit 5 maintains the off state of the switch S1, changes the switch S2 from the off state to the on state, and changes the switch S3 from the off state to the on state. In this way, the capacitors C2 and C3 are discharged, and each of the charge voltage $V_{CRG}$ of the capacitor C2 and the slope voltage $V_{SLP}$ becomes zero.

Then, the slope circuit 5 changes the switch S2 from the on state to the off state so as to finish discharging the capacitor C2. After that, the slope circuit 5 changes the switch S1 from the off state to the on state when the internal clock signal CLK is switched from low level to high level (at timing t32).

Next, when the internal clock signal CLK is switched from high level to low level (at timing t33), the slope circuit 5 changes the switch S1 from the on state to the off state.

During the period from the timing t32 to the timing t33, namely, during a constant period of time in the high level period of the set signal SET, the switch S1 forms the current path from the voltage current conversion circuit 4A to the capacitor C2. Accordingly, the voltage current conversion circuit 4A senses the current flowing in the lower MOS transistor Q2, and the information of the current flowing in the lower MOS transistor Q2 is accumulated in a form of the charge voltage $V_{CRG}$.

After that, the slope circuit 5 changes the switch S3 from the on state to the off state at timing t34. The timing of t34 can be the start timing of a dead time just after the lower MOS transistor Q2 is switched from the on state to the off state, for example. Because the output current of the voltage current conversion circuit 5A charges the capacitor C3 during the period from the timing t34 to the next timing t31, the information of the current flowing in the lower MOS transistor Q2 during the period from the timing t32 to the timing t33 is transmitted and reflected on the slope voltage $V_{SLP}$.

In the first generation example and the second generation example of the slope voltage described above, because an on period of the switch S1 depends on an on period of the upper MOS transistor Q1, the on period of the switch S1 varies depending on the ratio of the output voltage $V_{OUT}$ to the input voltage $V_{IN}$ of the switching power supply device 101, and hence there is a tendency that the control system of the current mode control becomes unstable. In contrast, in this generation example of the slope voltage, because the on period of the switch S1 is a constant period, the control system of the current mode control is stabilized.

In addition, in this generation example of the slope voltage, similarly to the second generation example of the slope voltage described above, the transmission of the information of the current flowing in the lower MOS transistor Q2 is started before the upper MOS transistor Q1 is switched from the off state to the on state so as to be reflected on the slope voltage $V_{SLP}$. Accordingly, in this generation example of the slope voltage, the minimum width of the switched voltage $V_{SW}$ that enables the current feedback can be smaller than that in the first generation example of the slope voltage described above.

Further, although the minimum pulse width of the switched voltage $V_{SW}$ that enables the current feedback is the same as that in the first generation example of the slope voltage described above, it is also possible to modify this generation example of the slope voltage in such a manner that the transmission of the information of the current flowing in the lower MOS transistor Q2 is started so as to be reflected on the slope voltage $V_{SLP}$ when the upper MOS transistor Q1 is switched from the off state to the on state.

Figure 6B:
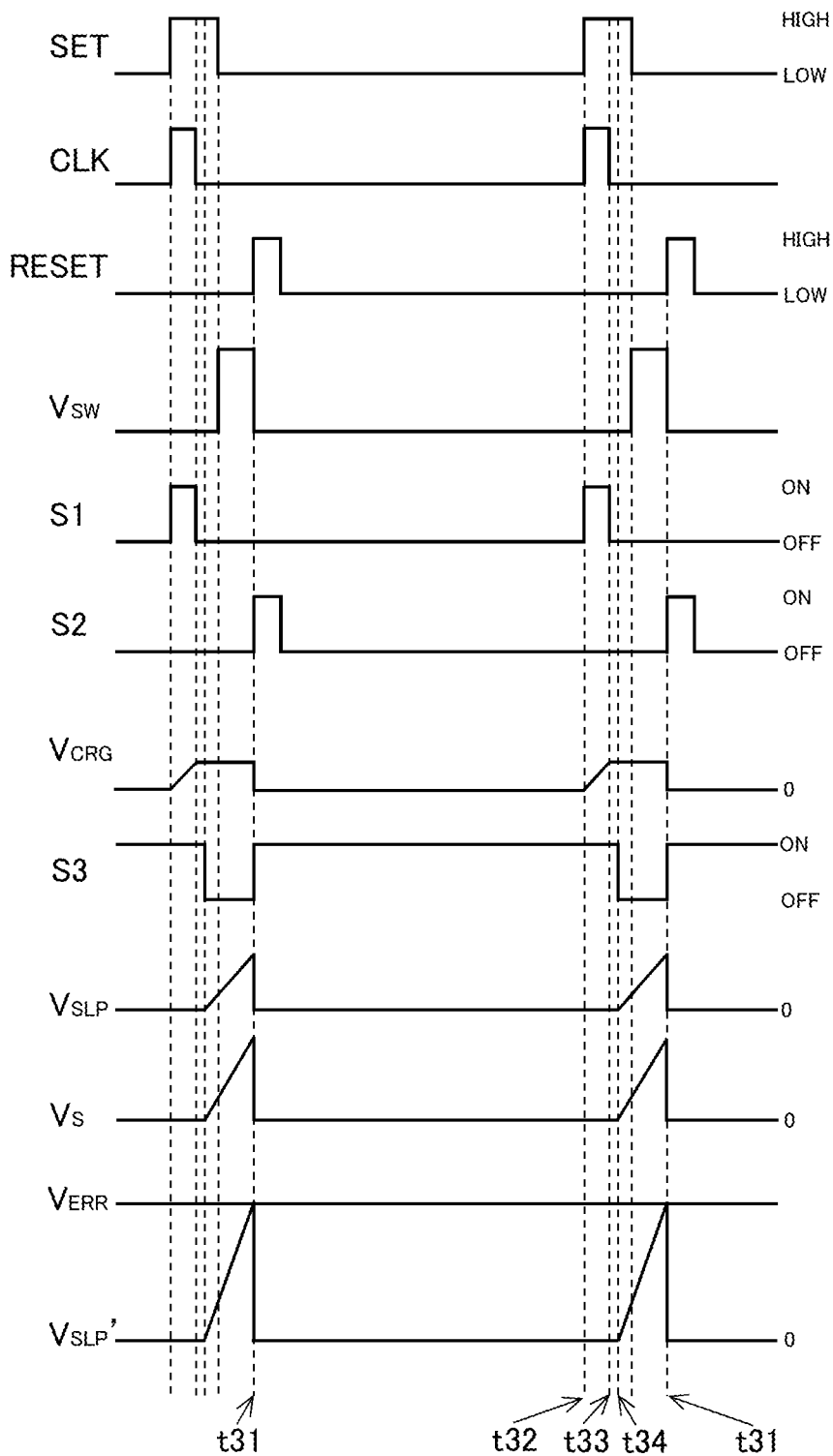
FIG. 6B is a timing chart showing a variation of the operation example shown in FIG. 6A.

Further, in view of more stabilizing the control system of the current mode control, it is preferred to dispose a superimposing portion in the slope circuit 5, so that the superimposing portion generates a voltage (a new slope voltage $V_{SLP}'$) in which a sawtooth wave-like or triangle wave-like pseudo slope voltage $V_S$ increasing at a constant rate during the period from the timing t34 to the timing t31 is superimposed on the slope voltage $V_{SLP}$, and to output the new slope voltage $V_{SLP}'$ as the output voltage of the slope circuit 5. In this case, as shown in FIG. 6B, when the slope voltage $V_{SLP}'$ exceeds the error signal $V_{ERR}$, the reset signal RESET is switched from low level to high level.

Fourth Generation Example of Slope Voltage

Figure 7:
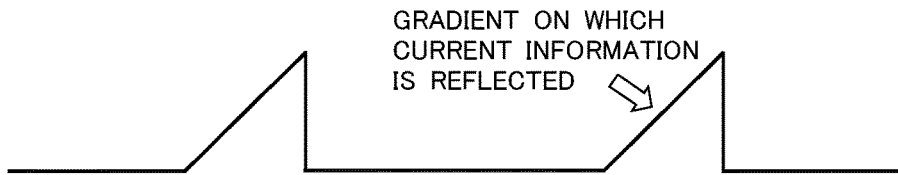
FIG. 7 is a diagram showing of a schematic waveform of a slope voltage having slope gradient on which current information is reflected.
Figure 8:
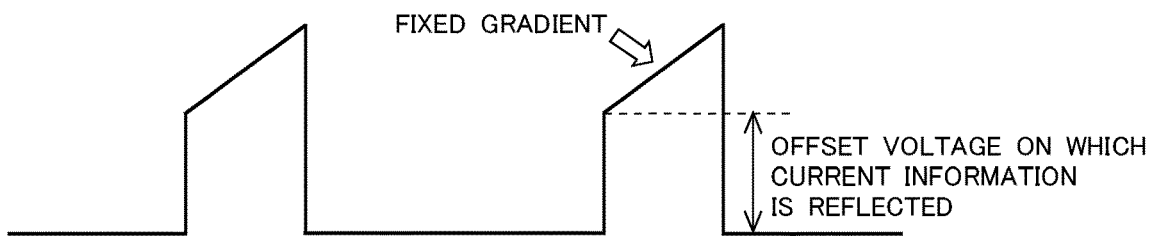
FIG. 8 is a diagram showing a schematic waveform of a slope voltage having a slope offset voltage on which the current information is reflected.

In the first to third generation examples of the slope voltage described above, the slope voltage is generated having a slope gradient on which the current information is reflected as shown in FIG. 7. In contrast, in this generation example, the slope voltage is generated having a slope offset voltage on which the current information is reflected as shown in FIG. 8.

When adopting the first to third generation examples of the slope voltage described above, operating conditions are limited because transfer characteristics (closed loop transfer function) of the control system depends on the input voltage $V_{IN}$ and output load (that is connected to the application terminal of the output voltage $V_{OUT}$). In contrast, when adopting this generation example, there is a merit that the operating conditions are not limited because the transfer characteristics (closed loop transfer function) of the control system do not depend on the input voltage $V_{IN}$ and the output load.

Hereinafter, a relationship among the transfer characteristics of the control system described above, the input voltage $V_{IN}$, and the output load is described below in detail.

(Case of Adopting First to Third Generation Examples of the Slope Voltage)

The relationship of the following equation (1) holds between an on duty D of the upper MOS transistor Q1 and a value $V_C$ of the error signal $V_{ERR}$ output from the error amplifier 2. Note that SE denotes a slope gradient (fixed value) of the pseudo slope voltage $V_S$, $S_N$ denotes a slope gradient on which the information of the current flowing in the lower MOS transistor Q2 is reflected, and T denotes a coefficient such that the maximum value of D becomes one.

$$D = \frac{V_C}{(S_N + S_E) \cdot T} \quad (1)$$

$$= \frac{(S_N + S_E) \cdot T \cdot \frac{V_{OUT}}{V_{IN}}}{(S_N + S_E) \cdot T}$$

Here, when the value $V_C$ of the error signal $V_{ERR}$ output from the error amplifier 2 varies by $\Delta V_C$, the on duty D of the upper MOS transistor Q1 varies by $\Delta D$, and hence the following equation (2) is satisfied. Note that $S_N'$ denotes the slope gradient on which the information of the current flowing in the lower MOS transistor Q2 is reflected.

$$D + \Delta D = \frac{V_C + \Delta V_C}{(S_N' + S_E) \cdot T} \quad (2)$$

$$= \frac{(S_N + S_E) \cdot T \cdot \frac{V_{OUT}}{V_{IN}} + \Delta V_C}{(S_N' + S_E) \cdot T}$$

In accordance with the above-mentioned equation (1) and equation (2), $\Delta D$ is expressed by the following equation (3).

$$\Delta D = \frac{(S_N - S_N') \cdot T \cdot \frac{V_{OUT}}{V_{IN}} + \Delta V_C}{(S_E + S_N') \cdot T} \quad (3)$$

Here, because $S_N$ is expressed by the following equation (4), the following equation (5) is satisfied. Note that $t_P$ denotes the accumulation time of the information of the current flowing in the lower MOS transistor Q2, and $I_{OUT}$ denotes the output current supplied to the output load. When the value $V_C$ of the error signal $V_{ERR}$ output from the error amplifier 2 varies by $\Delta V_C$, the output current $I_{OUT}$ varies by $\Delta I_{OUT}$.

$$S_N = \int_0^{t_P} A I_{OUT} dt \quad (4)$$

$$S_N' - S_N = \int_0^{t_P} A(I_{OUT} + \Delta I) dt - \int_0^{t_P} A I_{OUT} dt \quad (5)$$

$$= A \cdot \Delta I \cdot t_P$$

Here, $\Delta I$ is expressed by the following equation (6), and $\Delta V_{OUT}$ is expressed by the following equation (7). Note that $G_{DV(S)}$ is a parameter for shaping the switched voltage $V_{SW}$ into the output voltage $V_{OUT}$.

$$\Delta I = \frac{\Delta V_{OUT}}{Z_{OUT}} \quad (6)$$

$$\Delta V_{OUT} = V_{IN} \cdot \Delta D \cdot G_{DV(S)} \quad (7)$$

The above-mentioned equation (6) and equation (7) are substituted into the above-mentioned equation (3) and equation (5), and the equations are organized. Then, the following equation (8) is derived.

$$\frac{\Delta D}{\Delta V_C} = \frac{1}{(S_E + S'_N)T + \frac{\Delta V_{OUT} \cdot t_F T}{Z_{OUT}} G_{DV(S)}} \quad (8)$$

Using the above-mentioned equation (8), a ratio of $\Delta V_{OUT}$ to $\Delta V_C$ is expressed by the following equation (9).

$$\frac{\Delta V_{OUT}}{\Delta V_C} = \frac{\Delta D}{\Delta V_C} \cdot \frac{\Delta V_{OUT}}{\Delta D} \quad (9)$$

$$= \frac{V_{IN} \cdot G_{DV(S)}}{(S_E + S'_N)T + \frac{\Delta V_{OUT} \cdot t_F T}{Z_{OUT}} G_{DV(S)}}$$

$$= \frac{V_{IN} \cdot G_{DV(S)}}{(S_E + S'_N)T + \frac{S_N \cdot V_{OUT} T}{Z_{OUT} \cdot I_{OUT}} G_{DV(S)}}$$

As understood from the above-mentioned equation (9), when the input voltage $V_{IN}$ increases, a voltage gain is increased. When the output current $I_{OUT}$ increases, the $G_{DV(S)}$ of the denominator and the numerator are hardly cancelled by each other, and hence it becomes difficult to perform the current feedback. In other words, the transfer characteristics (closed loop transfer function) of the control system depend on the input voltage $V_{IN}$ and the output load.

(Case of Adopting this Generation Example of the Slope Voltage)

Similarly to the case of adopting the first to third generation examples of the slope voltage, the transfer characteristics of the control system are considered, and the following equation (12) is derived from the following equation (10). Note that $R_S$ denotes a parameter indicating how largely the current information is reflected as an offset voltage on the slope voltage and is expressed by the following equation (11).

$$\Delta D = \frac{\Delta V_C - R_S \cdot \Delta I}{S_E \cdot T} \quad (10)$$

$$R_S = \frac{V_{SLP}}{I_{OUT}} \quad (11)$$

$$\frac{\Delta V_{OUT}}{\Delta V_C} = \frac{V_{IN} \cdot G_{DV(S)}}{S_E \cdot T + \frac{R_S}{Z_{OUT}} V_{IN} G_{DV(S)}} \quad (12)$$

Here, the following equation (14) is satisfied when the condition of the following equation (13) is set.

$$S_E \cdot T \ll \frac{R_S}{Z_{OUT}} V_{IN} G_{DV(S)} \quad (13)$$

$$\frac{\Delta V_{OUT}}{\Delta V_C} = \frac{Z_{OUT}}{R_S} \quad (14)$$

As understood from the above-mentioned equation (14), the transfer characteristics of the control system (closed loop transfer function) does not depend on the input voltage $V_{IN}$ and the output load.

(Details of this Generation Example)

Next, details of this generation example are described. The current sensing circuit 4 and the slope circuit 5 have the structure shown in FIG. 9, and the switching power supply device 101 operates as shown in FIG. 10.

Figure 9:
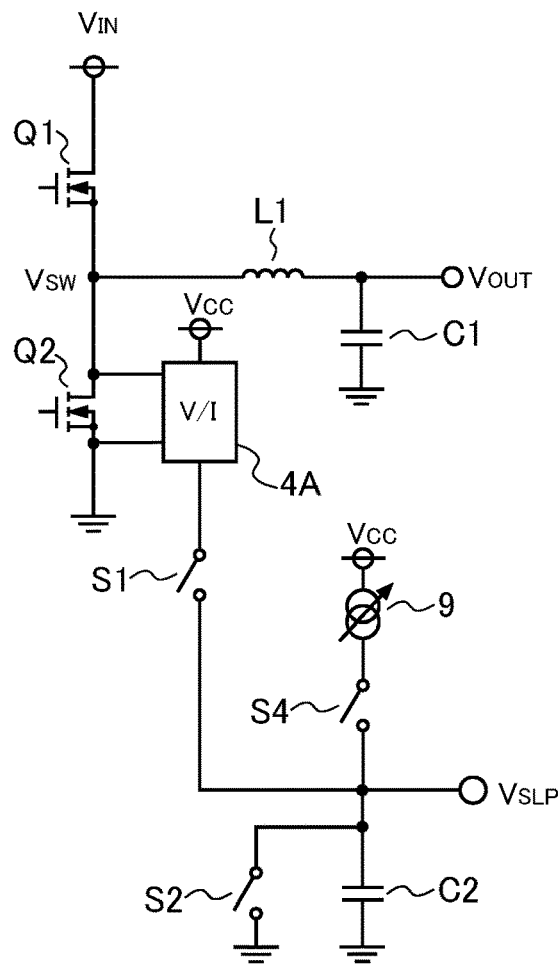
FIG. 9 is a diagram showing another structural example of the current sensing circuit and the slope circuit.
Figure 10:
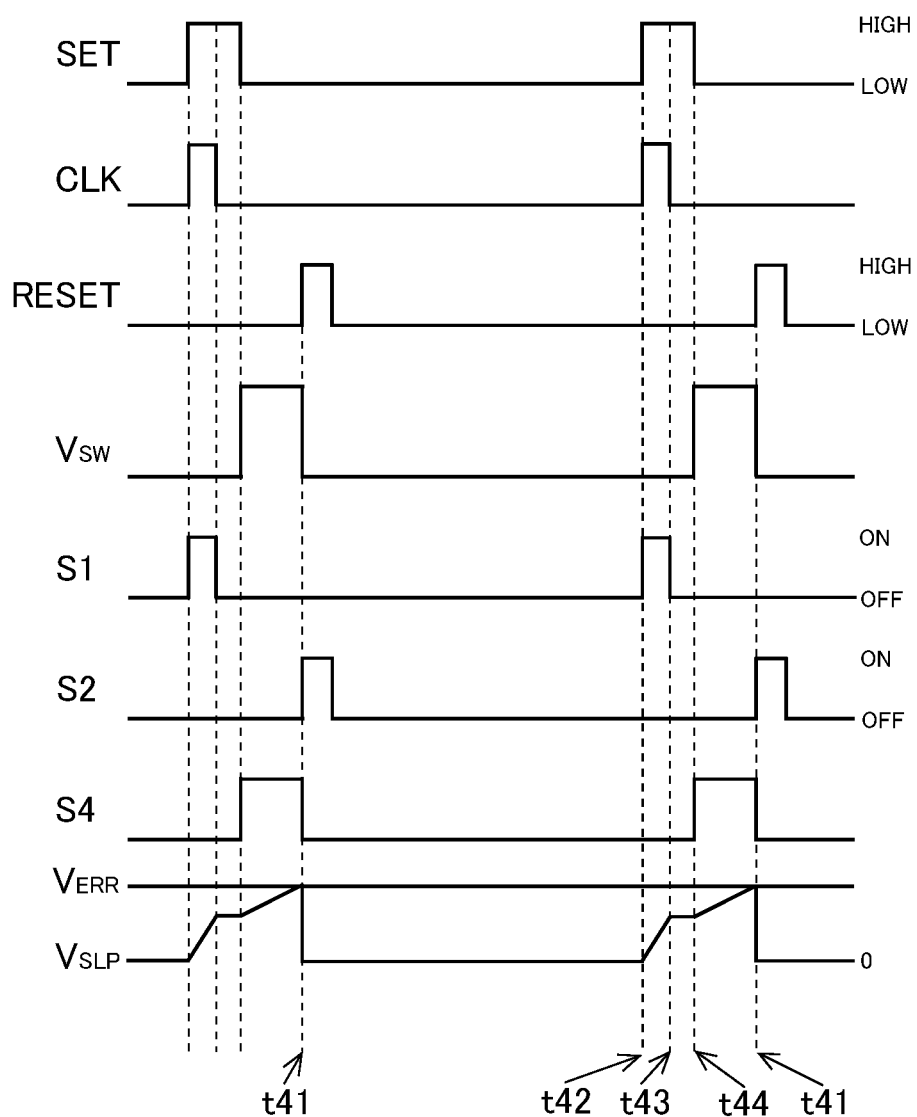
FIG. 10 is a timing chart showing still another operation example of the switching power supply device.

In the example shown in FIG. 9, the current sensing circuit 4 is constituted of the voltage current conversion circuit 4A. In addition, in the example shown in FIG. 9, the slope circuit 5 is constituted of switches S1, S2, and S4, the capacitor C2, and the constant current source 9. Note that it is preferred that a value of the constant current output from the constant current source 9 be adjustable.

Each of the voltage current conversion circuit 4A and the constant current source 9 is a circuit driven by the internal source voltage $V_{CC}$ generated in an integrated circuit (IC) including the timing control circuit 1, the error amplifier 2, the reference voltage source 3, the current sensing circuit 4, the slope circuit 5, the comparator 6, and the oscillator 7.

The voltage current conversion circuit 4A converts the drain-source voltage of the lower MOS transistor Q2 into current and outputs the current. When the switch S1 is on, the capacitor C2 is charged by the output current of the voltage current conversion circuit 4A. When the switch S4 is on, the capacitor C2 is charged by the output current of the constant current source 9. On the other hand, when the switch S2 is on, the capacitor C2 is discharged. The charge voltage of the capacitor C2 becomes the slope voltage $V_{SLP}$.

In the example shown in FIG. 10, the timing control circuit 1 switches the gate signal G1 from low level to high level when the set signal SET is switched from high level to low level, and switches the gate signal G1 from high level to low level when the reset signal RESET is switched from low level to high level.

In addition, the timing control circuit 1 is switched the internal clock signal CLK from low level to high level when the set signal SET is switched from low level to high level on the basis of the set signal SET, so as to generate the internal clock signal CLK having a high level period shorter than the high level period of the set signal SET. Note that each high level period of the internal clock signal CLK is a constant period of time during which the current feedback is performed in the fourth generation example of the slope voltage. Note that each high level period of the internal clock signal CLK should be adjusted so that the internal clock signal CLK is switched from high level to low level before the dead time starts just after the lower MOS transistor Q2 is switched from the on state to the off state.

Further, when the internal clock signal CLK is switched from low level to high level, regardless of a level changing state of the reset signal RESET, the timing control circuit 1 forces the gate signal G1 to be low level and the gate signal G2 to be high level. In this way, when the internal clock signal CLK is switched from low level to high level, the current feedback can be securely started.

The slope circuit 5 changes on and off of the switches S1, S2, and S4 in accordance with an instruction from the timing control circuit 1.

When the reset signal RESET is switched from low level to high level (at timing t41), the slope circuit 5 maintains the off state of the switch S1, changes the switch S2 from the off state to the on state, and changes the switch S4 from the on state to the off state. In this way, the capacitor C2 is discharged, and the slope voltage $V_{SLP}$ as the charge voltage of the capacitor C2 becomes zero.

Then, the slope circuit 5 changes the switch S2 from the on state to the off state so as to finish discharging the capacitor C2. After that, the slope circuit 5 changes the switch S1 from the off state to the on state when the internal clock signal CLK is switched from low level to high level (at timing t42).

Next, when the internal clock signal CLK is switched from high level to low level (at timing t43), the slope circuit 5 changes the switch S1 from the on state to the off state.

During the period from the timing t42 to the timing t43, the switch S1 forms the current path from the voltage current conversion circuit 4A to the capacitor C2. Accordingly, the information of the current flowing in the lower MOS transistor Q2 is accumulated in a form of the charge voltage of the capacitor C2.

Next, when the set signal SET is switched from high level to low level (at timing t44), the slope circuit 5 changes the switch S4 from the off state to the on state. During the period from the timing t44 to the next timing t41, the output current of the constant current source 9 charges the capacitor C2. In this way, the slope voltage $V_{SLP}$ as the charge voltage of the capacitor C2 becomes a voltage in which a voltage increasing at a constant ratio corresponding to the output current of the constant current source 9 (a gradient corresponding to the output current of the constant current source 9) is superimposed on the offset voltage on which the information of the current flowing in the lower MOS transistor Q2 is reflected. Further, the slope voltage $V_{SLP}$ as the charge voltage of the capacitor C2 becomes an output signal of the slope circuit 5.

In this generation example, the slope voltage $V_{SLP}$ having the slope offset voltage on which the information of the current flowing in the lower MOS transistor Q2 is reflected is generated. Accordingly, the transfer characteristics (closed loop transfer function) of the control system do not depend on the input voltage $V_{IN}$ and the output load. Accordingly, the operating condition of the switching power supply device 101 is not limited.

In addition, in this generation example, similarly to the second generation example of the slope voltage described above, the transmission of the information of the current flowing in the lower MOS transistor Q2 is started before the upper MOS transistor Q1 is switched from the off state to the on state so as to be reflected on the slope voltage $V_{SLP}$. Accordingly, in this generation example of the slope voltage, the minimum pulse width of the switched voltage $V_{SW}$ that enables the current feedback can be smaller than that of the first generation example of the slope voltage described above.

In addition, in this generation example, similarly to the third generation example of the slope voltage described above, the on period of the switch S1 is a constant period of time. Accordingly, the control system of the current mode control is stabilized.

General Structure (Second Embodiment)

Figure 11:
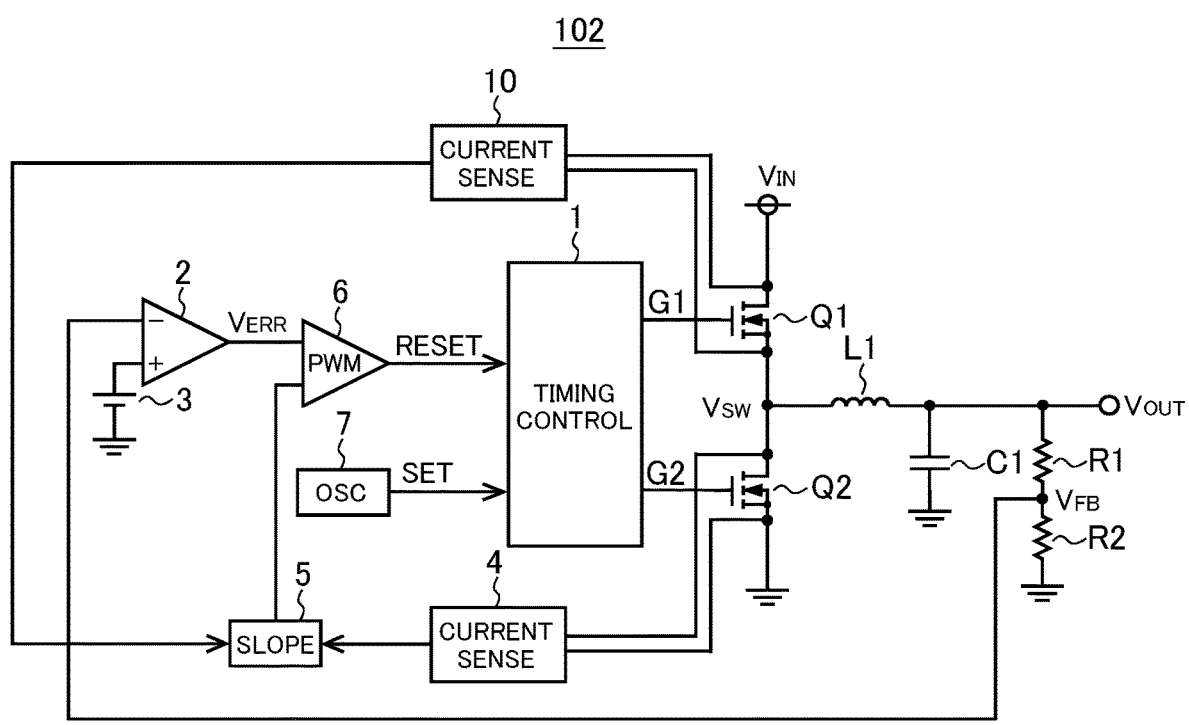
FIG. 11 is a diagram showing a general structural example of a second embodiment of the switching power supply device.

FIG. 11 is a diagram showing an example of a general structure of a second embodiment of the current mode control type switching power supply device. A switching power supply device 102 of this structural example has a structure in which a current sensing circuit 10 is added to the switching power supply device 101.

The current sensing circuit 10 senses the current flowing in the upper MOS transistor Q1 on the basis of the drain-source voltage in the on state of the upper MOS transistor Q1, namely the voltage between both ends of the on resistance of the upper MOS transistor Q1.

As described above in the first embodiment, the slope circuit 5 generates and outputs the slope voltage corresponding to the current flowing in the lower MOS transistor Q2 sensed by the current sensing circuit 4. In this way, even if the ratio of the output voltage $V_{OUT}$ to the input voltage $V_{IN}$ is small (even if the switched voltage $V_{SW}$ has a small pulse width), the current feedback can be performed. However, in the form in which the slope circuit 5 generates and outputs the slope voltage corresponding to the current flowing in the lower MOS transistor Q2 sensed by the current sensing circuit 4, when the pulse width of the switched voltage $V_{SW}$ becomes large, the period of time during which the current flowing in the lower MOS transistor Q2 can be sensed (while the lower MOS transistor Q2 is on) is decreased, and hence the current feedback may not be performed. In contrast, in the form in which the slope voltage corresponding to the current flowing in the upper MOS transistor Q1 is generated so as to perform the current mode control like the conventional technique, when the pulse width of the switched voltage $V_{SW}$ becomes large, the period of time during which the current flowing in the upper MOS transistor Q1 can be sensed (a period of time while the upper MOS transistor Q1 is on) is increased, and hence there is no possibility that the current feedback cannot be performed.

Thus, in accordance with an instruction from the timing control circuit 1, the slope circuit 5 of this embodiment generates and outputs the slope voltage corresponding to the current flowing in the lower MOS transistor Q2 sensed by the current sensing circuit 4 if the ratio of the output voltage to the input voltage ($V_{OUT}/V_{IN}$) of the switching power supply device 102 is 50% or less, while it generates and outputs the slope voltage corresponding to the current flowing in the upper MOS transistor Q1 sensed by the current sensing circuit 10 if $V_{OUT}/V_{IN}$ is more than 50%. In this way, the current feedback can be performed not only in the case where the pulse width of the switched voltage $V_{SW}$ is decreased but also in the case where the pulse width of the switched voltage $V_{SW}$ is increased.

The generation of the slope voltage corresponding to the current flowing in the lower MOS transistor Q2 sensed by the current sensing circuit 4 should be the same as that in each of the generation examples described above in the first embodiment, for example. In addition, the generation of the slope voltage corresponding to the current flowing in the upper MOS transistor Q1 sensed by the current sensing circuit 10 is known technique, and description thereof is omitted.

Figure 12A:
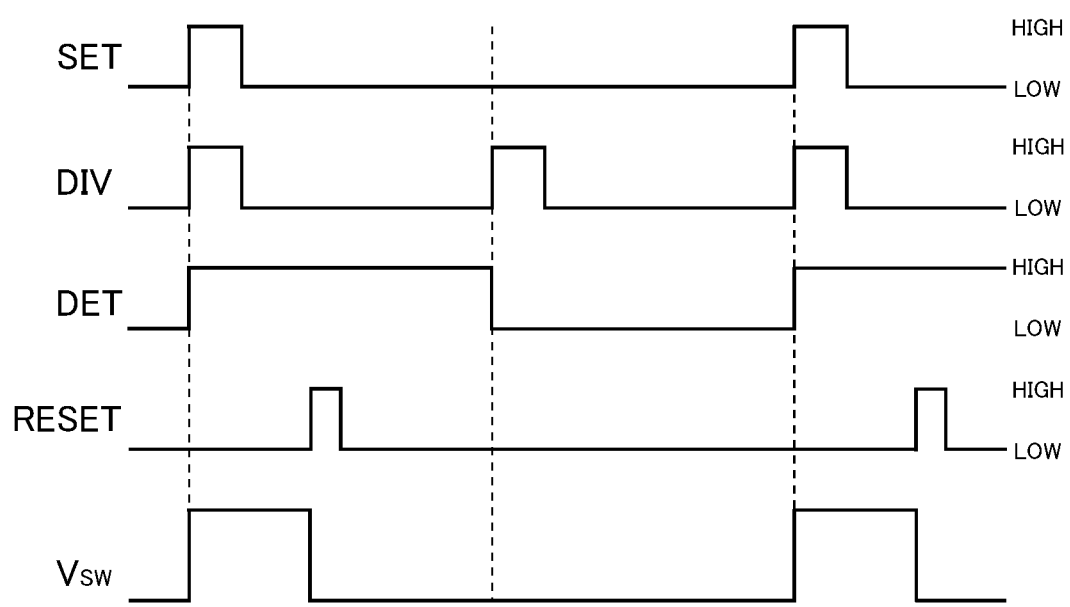
FIG. 12A is a timing chart showing an example of determination as to a ratio of an output voltage to an input voltage.

FIG. 12A is a timing chart showing an example of determination whether or not $V_{OUT}/V_{IN}$ is 50% or less. This determination is performed by the timing control circuit 1 that switches the gate signal G1 from low level to high level when the set signal SET is switched from low level to high level and switches the gate signal G1 from high level to low level when the reset signal RESET is switched from low level to high level.

The timing control circuit 1 generates a divided clock signal DIV based on the set signal SET. The divided clock signal DIV is a half-divided signal of the set signal SET in which the switch timing from low level to high level is the same as that of the set signal SET.

In addition, the timing control circuit 1 generates a sense clock signal DET based on the set signal SET and the divided clock signal DIV. The sense clock signal DET has the same switch timing from low level to high level as the set signal SET and the divided clock signal DIV, and is switched from high level to low level at timing when the divided clock signal DIV is switched from low level to high level and the set signal SET is not switched from low level to high level.

Further, the timing control circuit 1 determines that the $V_{OUT}/V_{IN}$ is more than 50% if the gate signal G1 is high level when the sense clock signal DET is switched from high level to low level (in this case, the switched voltage $V_{SW}$ is high level), and determines that the $V_{OUT}/V_{IN}$ is 50% or less if the gate signal G1 is low level when the sense clock signal DET is switched from high level to low level (in this case, the switched voltage $V_{SW}$ is low level).

Figure 12B:
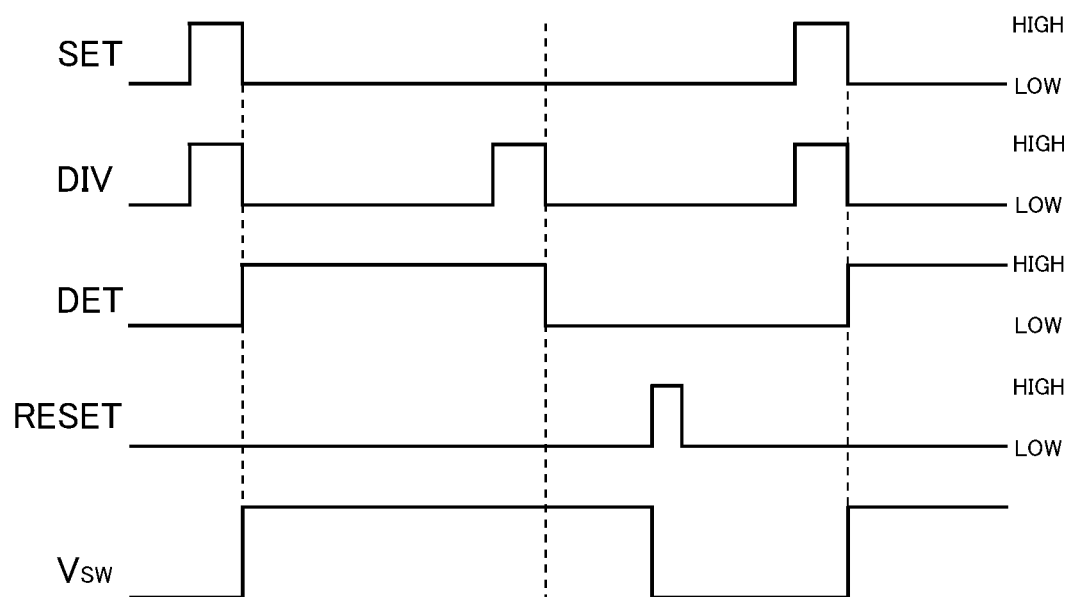
FIG. 12B is a timing chart showing another example of determination as to the ratio of the output voltage to the input voltage.

FIG. 12B is a timing chart showing another example of determination whether or not $V_{OUT}/V_{IN}$ is 50% or less. This determination is performed by the timing control circuit 1 that switches the gate signal G1 from low level to high level when the set signal SET is switched from high level to low level, and switches the gate signal G1 from high level to low level when the reset signal RESET is switched from low level to high level.

The timing control circuit 1 generates the divided clock signal DIV based on the set signal SET. The divided clock signal DIV is a half-divided signal of the set signal SET and has the same switch timing from high level to low level as the set signal SET.

In addition, the timing control circuit 1 generates the sense clock signal DET based on the set signal SET and the divided clock signal DIV. The sense clock signal DET has the switch timing from low level to high level that is the same as the switch timing of the set signal SET and the divided clock signal DIV from high level to low level, and is switched from high level to low level at timing when the divided clock signal DIV is switched from high level to low level and the set signal SET is not switched from high level to low level.

Further, the timing control circuit 1 determines that $V_{OUT}/V_{IN}$ is more than 50% if the gate signal G1 is high level when the sense clock signal DET is switched from high level to low level (in this case, the switched voltage $V_{SW}$ is high level), and determines that $V_{OUT}/V_{IN}$ is 50% or less if the gate signal G1 is low level when the sense clock signal DET is switched from high level to low level (in this case, the switched voltage $V_{SW}$ is low level).

In the above description, the slope circuit 5 outputs the slope voltage corresponding to the current flowing in the lower MOS transistor Q2 sensed by the current sensing circuit 4 if $V_{OUT}/V_{IN}$ is 50% or less. However, 50% is merely an example, and another value may be adopted.

Further in the above description, the slope circuit 5 outputs the slope voltage corresponding to the current flowing in the upper MOS transistor Q1 sensed by the current sensing circuit 10 if $V_{OUT}/V_{IN}$ is more than 50%. It is possible not to perform the current mode control if $V_{OUT}/V_{IN}$ is more than a predetermined value so as to avoid that the current feedback cannot be performed when the pulse width of the switched voltage $V_{SW}$ is increased. For instance, it is possible to adopt the following structure. The slope circuit 5 generates the pseudo slope voltage. If $V_{OUT}/V_{IN}$ is the predetermined value or smaller, the slope circuit 5 outputs a voltage in which the pseudo slope voltage is superimposed on the slope voltage corresponding to the current flowing in the lower MOS transistor Q2 sensed by the current sensing circuit 4 (a new slope voltage) as the output voltage of the slope circuit 5. If $V_{OUT}/V_{IN}$ is larger than the predetermined value, the slope circuit 5 outputs the pseudo slope voltage as the output voltage of the slope circuit 5.

<Applications>

Figure 13:
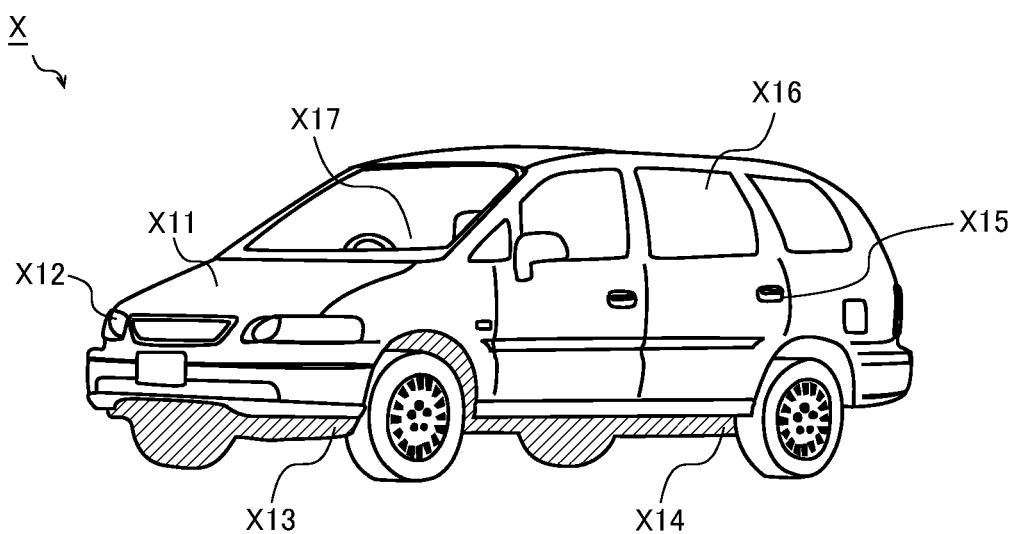
FIG. 13 is an outside view showing a structural example of a vehicle in which in-vehicle equipment is mounted.
Figure 14:
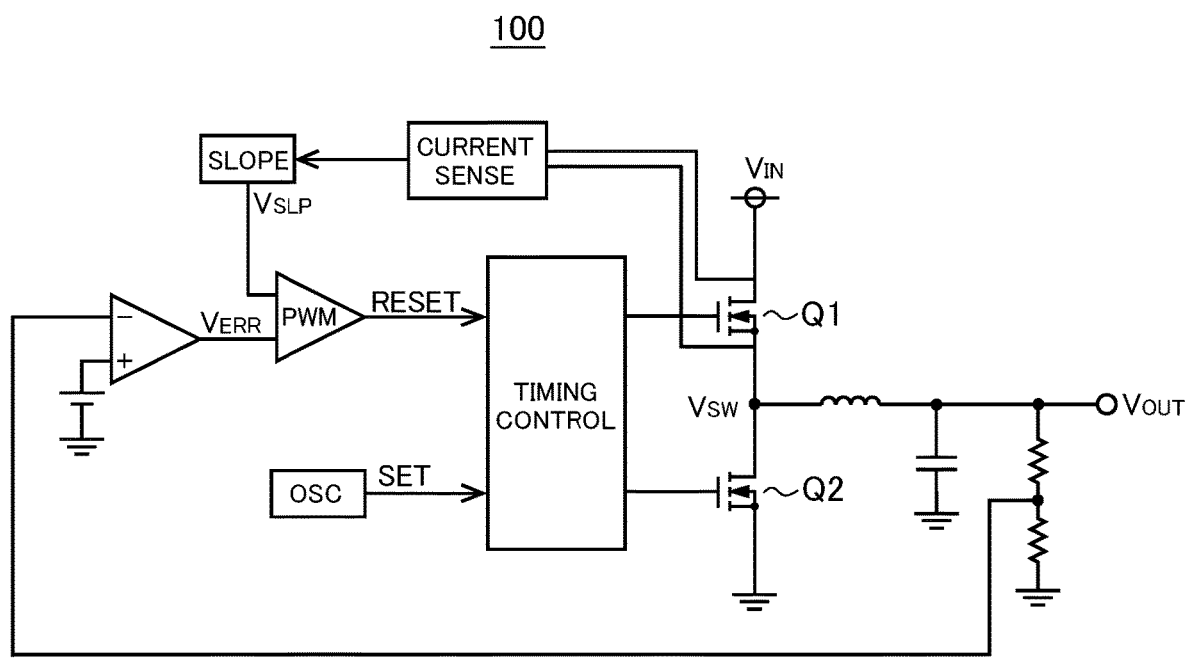
FIG. 14 is a diagram showing an example of a current mode control type switching power supply device.
Figure 15:
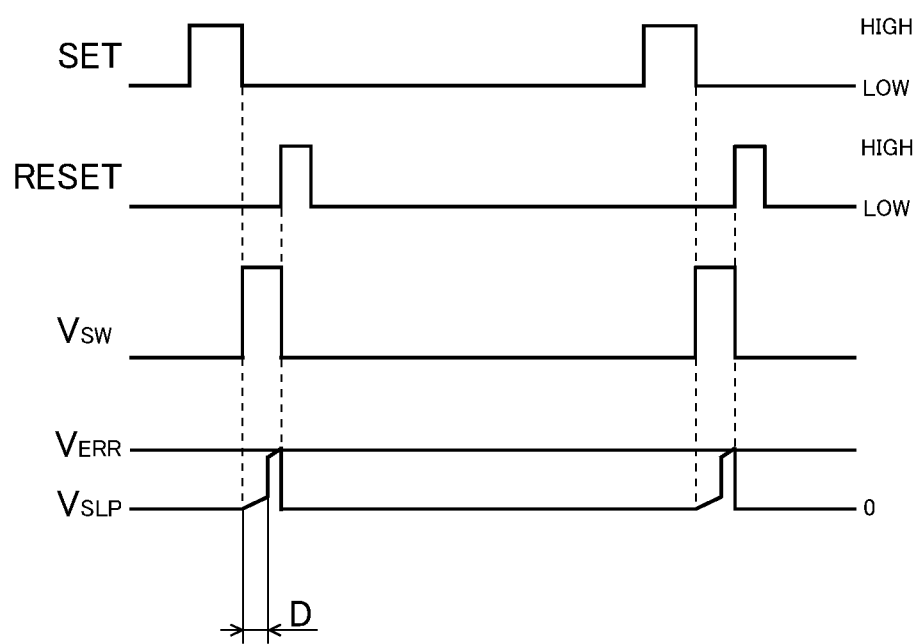
FIG. 15 is a timing chart showing an operation example of the switching power supply device shown in FIG. 14.

Next, there is described an application example of the switching power supply device 101 described above. FIG. 13 is an outside view showing a structural example of a vehicle in which in-vehicle equipment is mounted. A vehicle X of this structural example includes in-vehicle equipment X11 to X17 and a battery (not shown) configured to supply electric power to the in-vehicle equipment X11 to X17.

The in-vehicle equipment X11 is an engine control unit configured to perform control related to engine (such as injection control, electronic throttle control, idling control, oxygen sensor heater control, and automatic cruise control).

The in-vehicle equipment X12 is a lamp control unit configured to control on and off of a high intensity discharged lamp (HID), a daytime running lamp (DRL) and the like.

The in-vehicle equipment X13 is a transmission control unit configured to perform control related to transmission.

The in-vehicle equipment X14 is a body control unit configured to perform control related to movement of the vehicle X (such as anti-lock brake system (ABS) control, electric power steering (EPS) control, and electronic suspension control).

The in-vehicle equipment X15 is a security control unit configured to perform control for driving a door lock, an anti-theft alarm, and the like.

The in-vehicle equipment X16 is electronic equipment mounted in the vehicle X before shipping, as standard equipment or manufacturer optional equipment, such as wipers, electric door mirrors, power windows, electric sunroof, an electric sheet, and an air conditioner.

The in-vehicle equipment X17 is electronic equipment mounted in the vehicle X by user's intention, such as in-vehicle audio/visual (A/V) equipment, a car navigation system, and an electronic toll collection (ETC) system.

Note that the switching power supply device 101 described above can be incorporated in any one of the in-vehicle equipment X11 to X17 described above.

Another Variation Example

Note that the structure of the present invention can be variously modified from the embodiment described above within the scope of the invention without deviating from the spirit thereof.

For instance, the step-down type switching power supply device is exemplified in the embodiment described above, but applications of the present invention are not limited to this. The present invention can be applied also to a step-up/down type switching power supply device that can perform not only the step down operation but also a step up operation.

In this way, the embodiment described above is merely an example in every aspect and should not be interpreted as a limitation. The technical scope of the present invention should be defined not by the description of the embodiment described above but by the claims, which should be interpreted to include all modifications belonging to meanings and ranges equivalent to the claims.

<Summary>
(First Technical Feature)

Among the current mode control type switching power supply devices described above, the current mode control type switching power supply device having the first technical feature includes the first switch having the first terminal connected to the first application terminal to which the input voltage is applied, the second switch having the first terminal connected to the second terminal of the first switch and the second terminal connected to the second application terminal to which a predetermined voltage lower than the input voltage is applied, the current sensing portion configured to sense current flowing in the second switch, and the controller configured to control the first switch and the second switch in accordance with the current sensed by the current sensing portion. The controller includes an accumulating portion configured to accumulate information of the current sensed by the current sensing portion during a predetermined period of time while the first switch is in the off state, and a reflecting portion configured to start transmission of the current information accumulated by the accumulating portion before the first switch is changed from the off state to the on state so as to reflect the current information accumulated by the accumulating portion on the slope voltage, and controls the first switch and the second switch in accordance with the slope voltage (Structure 1-1).

In addition, in the current mode control type switching power supply device having Structure 1-1 described above, the accumulating portion and the reflecting portion may be circuits driven by the same source voltage (Structure 1-2).

In addition, in the current mode control type switching power supply device having Structure 1-1 or Structure 1-2, the current sensing portion may be the voltage current conversion circuit configured to convert the voltage corresponding to the current flowing in the second switch into current, the accumulating portion may include the capacitor to be charged by the output current of the voltage current conversion circuit, and the reflecting portion may reflect the charge voltage of the capacitor on the slope voltage (Structure 1-3).

In addition, in the current mode control type switching power supply device having Structure 1-3 described above, the accumulating portion may further include a charging switch configured to make and break the current path from the output terminal of the voltage current conversion circuit to the capacitor (Structure 1-4).

In addition, in the current mode control type switching power supply device having Structure 1-4 described above, the accumulating portion may change the charging switch from the off state to the on state at the end timing of the dead time just after the first switch is changed from the on state to the off state, and may change the charging switch from the on state to the off state at a start timing of a dead time just after the second switch is changed from the on state to the off state (Structure 1-5).

In addition, in the current mode control type switching power supply device having any one of Structures 1-3 to 1-5 described above, the accumulating portion may have a resetting portion configured to discharge the capacitor so as to reset the charge voltage of the capacitor (Structure 1-6).

In addition, in the current mode control type switching power supply device having any one of Structures 1-1 to 1-6 described above, the controller may include the error amplifier configured to generate an error signal corresponding to a difference between a voltage corresponding to the output voltage of the current mode control type switching power supply device and a reference voltage, the comparator configured to compare the slope voltage with the error signal so as to generate the reset signal as the comparison signal, the oscillator configured to generate the set signal as the clock signal of a predetermined frequency, and the timing control circuit configured to control on and off of the first switch and on and off of the second switch in accordance with the set signal and the reset signal (Structure 1-7).

In addition, in the current mode control type switching power supply device having any one of Structures 1-1 to 1-7 described above, the second switch may be a MOS transistor, and the current sensing portion may sense the current flowing in the second switch by using a voltage between both ends of the on resistor of the MOS transistor (Structure 1-8).

In addition, among the in-vehicle equipment disclosed in this specification, the in-vehicle equipment having the first technical feature includes the current mode control type switching power supply device having any one of Structures 1-1 to 1-8 (Structure 1-9).

In addition, among the vehicles disclosed in this specification, the vehicle having the first technical feature includes the in-vehicle equipment having Structure 1-9 and a battery configured to supply electric power to the in-vehicle equipment (Structure 1-10).

(Second Technical Feature)

Among the current mode control type switching power supply devices described above, the current mode control type switching power supply device having the second technical feature includes the first switch having the first terminal connected to the first application terminal to which the input voltage is applied, the second switch having the first terminal connected to the second terminal of the first switch and the second terminal connected to the second application terminal to which a predetermined voltage lower than the input voltage is applied, the current sensing portion configured to sense current flowing in the second switch, and the controller configured to control the first switch and the second switch in accordance with the current sensed by the current sensing portion. The controller includes a slope voltage generating portion configured to accumulate information of the current sensed by the current sensing portion during a predetermined period of time while the first switch is in the off state so as to generate the slope voltage based on the accumulated current information, and controls the first switch and the second switch in accordance with the slope voltage (Structure 2-1).

In addition, in the current mode control type switching power supply device having Structure 2-1 described above, the current sensing portion may be the voltage current conversion circuit configured to convert the voltage corresponding to the current flowing in the second switch into current, and the slope voltage generating portion may include the capacitor to be charged by the output current of the voltage current conversion circuit (Structure 2-2).

In addition, in the current mode control type switching power supply device having Structure 2-2 described above, the slope voltage generating portion may further include a charging switch configured to make and break the current path from the output terminal of the voltage current conversion circuit to the capacitor (Structure 2-3).

In addition, in the current mode control type switching power supply device having Structure 2-2 or 2-3 described above, the slope voltage generating portion may include the resetting portion configured to discharge the capacitor so as to reset the charge voltage of the capacitor (Structure 2-4).

In addition, in the current mode control type switching power supply device having any one of Structures 2-1 to 2-4 described above, the controller may include the error amplifier configured to generate the error signal corresponding to the difference between the voltage corresponding to the output voltage of the current mode control type switching power supply device and the reference voltage, the comparator configured to compare the slope voltage with the error signal so as to generate the reset signal as the comparison signal, the oscillator configured to generate the set signal as the clock signal of the predetermined frequency, and the timing control circuit configured to control on and off of the first switch and on and off of the second switch in accordance with the set signal and the reset signal (Structure 2-5).

In addition, in the current mode control type switching power supply device having any one of Structures 2-1 to 2-5, the second switch may be a MOS transistor, and the current sensing portion may sense the current flowing in the second switch by using the voltage between both ends of the on resistor of the MOS transistor (Structure 2-6).

In addition, among the in-vehicle equipment disclosed in this specification, the in-vehicle equipment having the second technical feature includes the current mode control type switching power supply device having any one of Structures 2-1 to 2-6 (Structure 2-7).

In addition, among the vehicles disclosed in this specification, the vehicle having the second technical feature includes the in-vehicle equipment having Structure 2-7 and a battery configured to supply electric power to the in-vehicle equipment (Structure 2-8).

(Third Technical Feature)

Among the current mode control type switching power supply devices described above, the current mode control type switching power supply device having the third technical feature includes the first switch having the first terminal connected to the first application terminal to which the input voltage is applied, the second switch having the first terminal connected to the second terminal of the first switch and the second terminal connected to the second application terminal to which a predetermined voltage lower than the input voltage is applied, the current sensing portion configured to sense current flowing in the second switch, and the controller configured to control the first switch and the second switch in accordance with the current sensed by the current sensing portion. The controller includes the accumulating portion configured to accumulate information of the current sensed by the current sensing portion during a constant period of time while the first switch is in the off state, and the reflecting portion configured to reflect the current information accumulated by the accumulating portion on the slope voltage, and controls the first switch and the second switch in accordance with the slope voltage (Structure 3-1).

In addition, in the current mode control type switching power supply device having Structure 3-1 described above, the controller includes the error amplifier configured to generate the error signal corresponding to a difference between the voltage corresponding to the output voltage of the current mode control type switching power supply device and the reference voltage, the comparator configured to compare the slope voltage with the error signal so as to generate the reset signal as the comparison signal, the oscillator configured to generate the set signal as the clock signal of a predetermined frequency, and the timing control circuit configured to control on and off of the first switch and on and off of the second switch in accordance with the set signal and the reset signal, and the constant period of time is set in the high level period of the set signal (Structure 3-2).

In addition, in the current mode control type switching power supply device having Structure 3-2 described above, the timing control circuit turns on the first switch when the set signal is switched from high level to low level, turns off the first switch when the reset signal is switched from low level to high level, and forcibly turns off the first switch and turns on the second switch regardless of the level changing state of the reset signal when the set signal is switched from low level to high level (Structure 3-3).

In addition, in the current mode control type switching power supply device having any one of Structures 3-1 to 3-3 described above, the accumulating portion and the reflecting portion may be circuits driven by the same source voltage (Structure 3-4).

In addition, in the current mode control type switching power supply device having any one of Structures 3-1 to 3-4 described above, the current sensing portion may be the voltage current conversion circuit configured to convert the voltage corresponding to the current flowing in the second switch into current, the accumulating portion may include the capacitor to be charged by the output current of the voltage current conversion circuit, and the reflecting portion reflects the charge voltage of the capacitor on the slope voltage (Structure 3-5).

In addition, in the current mode control type switching power supply device having Structure 3-5 described above, the accumulating portion may further include the charging switch configured to make and break the current path from the output terminal of the voltage current conversion circuit to the capacitor (Structure 3-6).

In addition, in the current mode control type switching power supply device having Structure 3-5 or 3-6 described above, the accumulating portion may include the resetting portion configured to discharge the capacitor so as to reset the charge voltage of the capacitor (Structure 3-7).

In addition, in the current mode control type switching power supply device having any one of Structures 3-1 to 3-7 described above, the reflecting portion may start the transmission of the current information accumulated by the accumulating portion before the first switch is changed from the off state to the on state so as to reflect the current information accumulated by the accumulating portion on the slope voltage (Structure 3-8).

In addition, in the current mode control type switching power supply device having any one of Structures 3-1 to 3-8 described above, the second switch may be a MOS transistor, and the current sensing portion may sense the current flowing in the second switch by using the voltage between both ends of the on resistor of the MOS transistor (Structure 3-9).

In addition, among the in-vehicle equipment disclosed in this specification, the in-vehicle equipment having the third technical feature may include the current mode control type switching power supply device having any one of Structures 3-1 to 3-9 (Structure 3-10).

In addition, among the vehicles disclosed in this specification, the vehicle having the third technical feature may include the in-vehicle equipment of Structure 3-10 and a battery configured to supply electric power to the in-vehicle equipment (Structure 3-11).

(Fourth Technical Feature)

Among the current mode control type switching power supply devices described above, the current mode control type switching power supply device having the fourth technical feature includes the first switch having the first terminal connected to the first application terminal to which the input voltage is applied, the second switch having the first terminal connected to the second terminal of the first switch and the second terminal connected to the second application terminal to which a predetermined voltage lower than the input voltage is applied, the current sensing portion configured to sense current flowing in the second switch, and the controller configured to control the first switch and the second switch in accordance with the current sensed by the current sensing portion. The controller includes the accumulating portion configured to accumulate information of the current sensed by the current sensing portion during a predetermined period of time while the first switch is in the off state, the reflecting portion configured to reflect the current information accumulated by the accumulating portion on the offset voltage of the slope voltage, and a gradient setting portion configured to set the slope gradient of the slope voltage to a constant value, and controls the first switch and the second switch in accordance with the slope voltage (Structures 4-1).

In addition, in the current mode control type switching power supply device having Structure 4-1 described above, the predetermined period of time may be a constant period of time (Structures 4-2).

In addition, in the current mode control type switching power supply device having Structure 4-1 or 4-2 described above, the reflecting portion may start the transmission of the current information accumulated by the accumulating portion before the first switch is changed from the off state to the on state so as to reflect the current information accumulated by the accumulating portion on the offset voltage of the slope voltage (Structures 4-3).

In addition, in the current mode control type switching power supply device having any one of Structures 4-1 to 4-3 described above, the current sensing portion may be the voltage current conversion circuit configured to convert the voltage corresponding to the current flowing in the second switch into current, and the accumulating portion and the reflecting portion share the capacitor to be charged by the output current of the voltage current conversion circuit (Structures 4-4).

In addition, in the current mode control type switching power supply device having Structure 4-4 described above, the gradient setting portion may include the constant current source, and a switch for the slope configured to make and break the current path from the constant current source to the capacitor (Structures 4-5).

In addition, in the current mode control type switching power supply device having Structure 4-4 or 4-5 described above, the accumulating portion may further include the charging switch configured to make and break the current path from the output terminal of the voltage current conversion circuit to the capacitor (Structures 4-6).

In addition, in the current mode control type switching power supply device having any one of Structures 4-4 to 4-6 described above, the accumulating portion may include the resetting portion configured to discharge the capacitor so as to reset the charge voltage of the capacitor (Structures 4-7).

In addition, in the current mode control type switching power supply device having any one of Structures 4-1 to 4-7 described above, the controller may include the error amplifier configured to generate the error signal corresponding to the difference between the voltage corresponding to the output voltage and the reference voltage, the comparator configured to compare the slope voltage with the error signal so as to generate the reset signal as the comparison signal, the oscillator configured to generate the set signal as the clock signal of a predetermined frequency, and the timing control circuit configured to control on and off of the first switch and on and off of the second switch in accordance with the set signal and the reset signal (Structures 4-8).

In addition, in the current mode control type switching power supply device having any one of Structures 4-1 to 4-8 described above, the second switch is a MOS transistor, the current sensing portion senses the current flowing in the second switch by using the voltage between both ends of the on resistor of the MOS transistor (Structures 4-9).

In addition, among the in-vehicle equipment disclosed in this specification, the in-vehicle equipment having the fourth technical feature includes the current mode control type switching power supply device having any one of Structures 4-1 to 4-9 (Structure 4-10).

In addition, among the vehicles disclosed in this specification, the vehicle having the fourth technical feature includes the in-vehicle equipment having Structure 4-10 and a battery configured to supply electric power to the in-vehicle equipment (Structure 4-11).

(Fifth Technical Feature)

Among the current mode control type switching power supply devices described above, the current mode control type switching power supply device having the fifth technical feature includes the first switch having the first terminal connected to the first application terminal to which the input voltage is applied, the second switch having the first terminal connected to the second terminal of the first switch and the second terminal connected to the second application terminal to which a predetermined voltage lower than the input voltage is applied, the current sensing portion configured to sense current flowing in the second switch, and the controller configured to control the first switch and the second switch. If the ratio of the output voltage to the input voltage is a predetermined value or lower, the controller controls the first switch and the second switch in accordance with the current sensed by the current sensing portion. If the ratio of the output voltage to the input voltage is higher than the predetermined value, the controller controls the first switch and the second switch independently of the current sensed by the current sensing portion (Structure 5-1).

In addition, the current mode control type switching power supply device having Structure 5-1 described above may further include a current sensing portion for the first switch configured to sense current flowing in the first switch, and the controller may control the first switch and the second switch in accordance with the current sensed by the current sensing portion for the first switch if the ratio of the output voltage to the input voltage is higher than the predetermined value (Structure 5-2).

In addition, in the current mode control type switching power supply device having Structure 5-1 or 5-2 described above, the controller may include the slope voltage generating portion configured to accumulate information of the current sensed by the current sensing portion during a predetermined period of time while the first switch is in the off state so as to generate the slope voltage based on the accumulated current information if the ratio of the output voltage to the input voltage is a predetermined value or lower, and may control the first switch and the second switch in accordance with the slope voltage if the ratio of the output voltage to the input voltage is a predetermined value or lower (Structure 5-3).

In addition, in the current mode control type switching power supply device having Structure 5-3 described above, the current sensing portion may be the voltage current conversion circuit configured to convert the voltage corresponding to the current flowing in the second switch into current, and the slope voltage generating portion may include the capacitor to be charged by the output current of the voltage current conversion circuit (Structure 5-4).

In addition, in the current mode control type switching power supply device having Structure 5-4 described above, the slope voltage generating portion may further include the charging switch configured to make and break the current path from the output terminal of the voltage current conversion circuit to the capacitor (Structure 5-5).

In addition, in the current mode control type switching power supply device having Structure 5-4 or 5-5 described above, the slope voltage generating portion may include the resetting portion configured to discharge the capacitor so as to reset the charge voltage of the capacitor (Structure 5-6).

In addition, in the current mode control type switching power supply device having any one of Structures 5-3 to 5-6 described above, the controller may include the error amplifier configured to generate the error signal corresponding to the difference between the voltage corresponding to the output voltage and the reference voltage, the comparator configured to compare the slope voltage with the error signal so as to generate the reset signal as the comparison signal, the oscillator configured to generate the set signal as the clock signal of a predetermined frequency, and the timing control circuit configured to control on and off of the first switch and on and off of the second switch in accordance with the set signal and the reset signal (Structure 5-7).

In addition, in the current mode control type switching power supply device having any one of Structures 5-1 to 5-7 described above, the second switch may be a MOS transistor, and the current sensing portion may sense the current flowing in the second switch by using the voltage between both ends of the on resistor of the MOS transistor (Structure 5-8).

In addition, among the in-vehicle equipment disclosed in this specification, the in-vehicle equipment having the fifth technical feature includes the current mode control type switching power supply device having any one of Structures 5-1 to 5-8 (Structure 5-9).

In addition, among the vehicles disclosed in this specification, the vehicle having the fifth technical feature includes the in-vehicle equipment having Structure 5-9 and a battery configured to supply electric power to the in-vehicle equipment (Structure 5-10).

INDUSTRIAL APPLICABILITY

The present invention can be used for current mode control type switching power supply devices used in various fields (such as home appliances, automobiles, and industrial machines).

What is claimed is:

1. A current mode control type switching power supply device comprising:
    a first switch having a first terminal connected to a first application terminal to which an input voltage is applied;
    a second switch having a first terminal connected to a second terminal of the first switch and a second terminal connected to a second application terminal to which a predetermined voltage lower than the input voltage is applied;
    a current sensor configured to sense current flowing in the second switch; and
    a controller configured to control the first switch and the second switch, wherein
    if a ratio of an output voltage to the input voltage is a predetermined value or lower, the controller controls the first switch and the second switch in accordance with the current sensed by the current sensor.

2. The current mode control type switching power supply device according to claim 1, wherein
    the controller includes a slope voltage generator configured to accumulate information of the current sensed by the current sensor during a predetermined period of time while the first switch is in the off state so as to generate a slope voltage based on the accumulated current information if the ratio of the output voltage to the input voltage is a predetermined value or lower, and
    the controller controls the first switch and the second switch in accordance with the slope voltage if the ratio of the output voltage to the input voltage is a predetermined value or lower.

3. The current mode control type switching power supply device according to claim 2, wherein
    the current sensor is a voltage current conversion circuit configured to convert a voltage corresponding to current flowing in the second switch into current, and
    the slope voltage generator includes a capacitor to be charged by an output current of the voltage current conversion circuit.

4. The current mode control type switching power supply device according to claim 3, wherein the slope voltage generator further includes a charging switch configured to make and break a current path from an output terminal of the voltage current conversion circuit to the capacitor.

5. The current mode control type switching power supply device according to claim 3, wherein the slope voltage generator includes a resetter configured to discharge the capacitor so as to reset a charge voltage of the capacitor.

6. The current mode control type switching power supply device according to claim 2, wherein the controller includes
    an error amplifier configured to generate an error signal corresponding to a difference between a voltage corresponding to the output voltage and a reference voltage,
    a comparator configured to compare the slope voltage with the error signal so as to generate a reset signal as a comparison signal,
    an oscillator configured to generate a set signal as a clock signal of a predetermined frequency, and
    a timing control circuit configured to control on and off of the first switch and on and off of the second switch in accordance with the set signal and the reset signal.

7. The current mode control type switching power supply device according to claim 6, wherein
    the comparator sets the reset signal to high level if the slope voltage is higher than the error signal, and sets the reset signal to low level if the slope voltage is not higher than the error signal, and
    the timing control circuit changes the first switch from the on state to the off state when the reset signal is switched from low level to high level.

8. The current mode control type switching power supply device according to claim 6, wherein the timing control circuit changes the first switch from the off state to the on state either when the set signal is switched from low level to high level or when the set signal is switched from high level to low level.

9. The current mode control type switching power supply device according to claim 1, wherein
    the second switch is a MOS transistor, and
    the current sensor senses the current flowing in the second switch by using a voltage between both ends of an on resistor of the MOS transistor.

10. In-vehicle equipment comprising the current mode control type switching power supply device according to claim 1.

11. A vehicle comprising:
the in-vehicle equipment according to claim 10; and
a battery configured to supply electric power to the in-vehicle equipment.

12. An IC comprising:
a controller configured to control
a first switch having a first terminal connected to a first application terminal to which an input voltage is applied and
a second switch having a first terminal connected to a second terminal of the first switch and a second terminal connected to a second application terminal to which a predetermined voltage lower than the input voltage is applied; and
a current sensor configured to sense current flowing in the second switch, wherein
if a ratio of an output voltage to the input voltage is a predetermined value or lower, the controller controls the first switch and the second switch in accordance with the current sensed by the current sensor.

13. In-vehicle equipment comprising the IC according to claim 12.

14. A vehicle comprising:
the in-vehicle equipment according to claim 13; and
a battery configured to supply electric power to the in-vehicle equipment.

* * * * *